(12) United States Patent
Sato

(10) Patent No.: US 7,498,773 B2
(45) Date of Patent: Mar. 3, 2009

(54) INFORMATION TERMINAL AND BATTERY REMAINING CAPACITY CALCULATING METHOD

(75) Inventor: Jun Sato, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/751,338

(22) Filed: May 21, 2007

(65) Prior Publication Data

US 2007/0210754 A1 Sep. 13, 2007

Related U.S. Application Data

(62) Division of application No. 11/093,020, filed on Mar. 30, 2005.

(30) Foreign Application Priority Data

| Mar. 30, 2004 | (JP) | ................ 2004-98569 |
| Jul. 1, 2004 | (JP) | ............... 2004-195677 |
| Jan. 31, 2005 | (JP) | ................ 2005-24089 |

(51) Int. Cl.
    *H02J 7/00* (2006.01)
(52) U.S. Cl. ..................................... 320/132
(58) Field of Classification Search ................. 320/132; 348/372
    See application file for complete search history.

(56) References Cited

U.S. PATENT DOCUMENTS 5,623,210 A 4/1997 Sakamoto

| 6,174,617 B1* | 1/2001 | Hiratsuka et al. ............. 429/90 |
| 2001/0026263 A1* | 10/2001 | Kanamori et al. ........... 345/156 |
| 2002/0018137 A1* | 2/2002 | Tsuda ................... 348/333.02 |

FOREIGN PATENT DOCUMENTS

| JP | 05-066251 A | 3/1993 |
| JP | 06-051876 A | 2/1994 |
| JP | 7-260839 A | 10/1995 |
| JP | 07-282857 | 10/1995 |
| JP | 11-055372 A | 2/1999 |
| JP | 11-162524 A | 6/1999 |
| JP | 2001-126778 | 5/2001 |
| JP | 2002-062955 | 2/2002 |

* cited by examiner

*Primary Examiner*—Gary L Laxton
*Assistant Examiner*—Yalkew Fantu
(74) *Attorney, Agent, or Firm*—Sughrue Mion, PLLC

(57) ABSTRACT

An information terminal driven by a battery disclosed herein comprises: a voltage detector configured to detect a battery voltage which is a voltage of the battery; a drive unit configured to be driven upon receiving a supply of a power source from the battery; a load calculator configured to calculate a load on the battery of the drive unit; and a battery remaining capacity calculator configured to calculate a battery remaining capacity based on the battery voltage, the battery remaining capacity calculator calculating the battery remaining capacity corrected based on the load calculated by the load calculator.

15 Claims, 26 Drawing Sheets

TB10

| VOLTAGE ACCORDING TO LOAD AT EXTREMELY LOW TEMPERATURE: 5°C | | | |
|---|---|---|---|
| LOAD STATE | LOW LOAD | MEDIUM LOAD | HIGH LOAD |
| [mA]⇒ | 400 | 800 | 1200 |
| REMAINING CAPACITY | BATTERY VOLTAGE VALUE | | |
| 100 | 4.20 | 4.20 | 4.20 |
| 90 | 3.93 | 3.83 | 3.73 |
| 80 | 3.87 | 3.77 | 3.67 |
| 70 | 3.81 | 3.71 | 3.61 |
| 60 | 3.75 | 3.65 | 3.55 |
| 50 | 3.69 | 3.59 | 3.49 |
| 40 | 3.63 | 3.53 | 3.43 |
| 30 | 3.57 | 3.47 | 3.37 |
| 20 | 3.51 | 3.41 | 3.31 |
| 10 | 3.45 | 3.35 | 3.25 |
| 5 | 3.42 | 3.32 | 3.22 |
| 2 | 3.39 | 3.29 | 3.19 |
| 0 | 3.00 | 3.00 | 3.00 |

| VOLTAGE ACCORDING TO LOAD AT LOW TEMPERATURE: 15°C ||||
|---|---|---|---|
| LOAD STATE | LOW LOAD | MEDIUM LOAD | HIGH LOAD |
| [mA]⇒ | 400 | 800 | 1200 |
| REMAINING CAPACITY | BATTERY VOLTAGE VALUE |||
| 100 | 4.20 | 4.20 | 4.20 |
| 90 | 3.97 | 3.87 | 3.77 |
| 80 | 3.91 | 3.81 | 3.71 |
| 70 | 3.85 | 3.75 | 3.65 |
| 60 | 3.79 | 3.69 | 3.59 |
| 50 | 3.73 | 3.63 | 3.53 |
| 40 | 3.67 | 3.57 | 3.47 |
| 30 | 3.61 | 3.51 | 3.41 |
| 20 | 3.55 | 3.45 | 3.35 |
| 10 | 3.49 | 3.39 | 3.29 |
| 5 | 3.46 | 3.36 | 3.26 |
| 2 | 3.43 | 3.33 | 3.23 |
| 0 | 3.00 | 3.00 | 3.00 |

TB30

| VOLTAGE ACCORDING TO LOAD AT MEDIUM TEMPERATURE: 25°C | | | |
|---|---|---|---|
| LOAD STATE | LOW LOAD | MEDIUM LOAD | HIGH LOAD |
| [mA]⇒ | 400 | 800 | 1200 |
| REMAINING CAPACITY | BATTERY VOLTAGE VALUE | | |
| 100 | 4.20 | 4.20 | 4.20 |
| 90 | 4.01 | 3.91 | 3.81 |
| 80 | 3.95 | 3.85 | 3.75 |
| 70 | 3.89 | 3.79 | 3.69 |
| 60 | 3.83 | 3.73 | 3.63 |
| 50 | 3.77 | 3.67 | 3.57 |
| 40 | 3.71 | 3.61 | 3.51 |
| 30 | 3.65 | 3.55 | 3.45 |
| 20 | 3.59 | 3.49 | 3.39 |
| 10 | 3.53 | 3.43 | 3.33 |
| 5 | 3.50 | 3.40 | 3.30 |
| 2 | 3.47 | 3.37 | 3.27 |
| 0 | 3.00 | 3.00 | 3.00 |

| VOLTAGE ACCORDING TO LOAD AT HIGH TEMPERATURE: 45°C | | | |
|---|---|---|---|
| LOAD STATE | LOW LOAD | MEDIUM LOAD | HIGH LOAD |
| [mA]⇒ | 400 | 800 | 1200 |
| REMAINING CAPACITY | BATTERY VOLTAGE VALUE | | |
| 100 | 4.20 | 4.20 | 4.20 |
| 90 | 4.05 | 3.95 | 3.85 |
| 80 | 3.99 | 3.89 | 3.79 |
| 70 | 3.93 | 3.83 | 3.73 |
| 60 | 3.87 | 3.77 | 3.67 |
| 50 | 3.81 | 3.71 | 3.61 |
| 40 | 3.75 | 3.65 | 3.55 |
| 30 | 3.69 | 3.59 | 3.49 |
| 20 | 3.63 | 3.53 | 3.43 |
| 10 | 3.57 | 3.47 | 3.37 |
| 5 | 3.54 | 3.44 | 3.34 |
| 2 | 3.51 | 3.41 | 3.31 |
| 0 | 3.00 | 3.00 | 3.00 |

| 20°C VOLTAGE-REMAINING CAPACITY CONVERSION TABLE ||||
|---|---|---|---|
| LOAD STATE | LOW LOAD | MEDIUM LOAD | HIGH LOAD |
| [mA] | 400 | 800 | 1200 |
| REMAINING CAPACITY | BATTERY VOLTAGE VALUE |||
| 100 | 4.20 | 4.20 | 4.20 |
| 90 | 3.99 | 3.89 | 3.79 |
| 80 | 3.93 | 3.83 | 3.73 |
| 70 | 3.87 | 3.77 | 3.67 |
| 60 | 3.81 | 3.71 | 3.61 |
| 50 | 3.75 | 3.65 | 3.55 |
| 40 | 3.69 | 3.59 | 3.49 |
| 30 | 3.63 | 3.53 | 3.43 |
| 20 | 3.57 | 3.47 | 3.37 |
| 10 | 3.51 | 3.41 | 3.31 |
| 5 | 3.48 | 3.38 | 3.28 |
| 2 | 3.45 | 3.35 | 3.25 |
| 0 | 3.00 | 3.00 | 3.00 |

FIG.8

CURRENT CONSUMPTION VALUE AND
ABBREVIATION IN EACH OPERATING STATE

| OPERATING STATE | ABBREVIATION | CURRENT CONSUMPTION |
|---|---|---|
| ACCESS | AC LOAD | 600 |
| PERFORMANCE IDLE | PI LOAD | 400 |
| ACTIVE IDLE | AI LOAD | 190 |
| LOW POWER IDLE | LPI LOAD | 170 |
| STANDBY | ST LOAD | 40 |

32 SAMPLINGS/SECOND
(SAMPLING EVERY 31.25 msec)

FIG.10

CONSTANT LOAD CHANGE ACCORDING TO OPERATION MODE

| OPERATION MODE | USB DATA TRANSFER | STILL IMAGE REPRODUCTION (SLIDE SHOW) | MOVING IMAGE REPRODUCTION | UNIT |
|---|---|---|---|---|
| CONSTANT LOAD | 200 | 400 | 450 | [mA] |

FIG.18

INFORMATION TERMINAL AND BATTERY REMAINING CAPACITY CALCULATING METHOD

CROSS REFERENCE TO RELATED APPLICATION

This application is a divisional application of application Ser. No. 11/093,020 which claims benefit of priority under 35 U.S.C. § 119 to Japanese Patent Application No. 2004-98569, filed on Mar. 30, 2004, Japanese Patent Application No. 2004-195677, filed on Jul. 1, 2004 and Japanese Patent Application No. 2005-24089, filed on Jan. 31, 2005. The entire contents of which are incorporated by reference herein.

BACKGROUND OF THE INVENTION

1. Field of the Invention

The present invention relates to an information terminal and a battery remaining capacity calculating method.

2. Related Background Art

Examples of a small-sized information terminal using a battery are a digital camera, a portable moving image reproducing apparatus, a portable sill image reproducing apparatus, and so on. Recently, a unit such as a hard disk drive which exerts a large influence on load change is mounted in such a small-sized information terminal, and hence the load on the battery changes greatly according to the driving state of the unit.

It is very important to users to precisely display a battery remaining capacity as means for guessing how much more time the information terminal can be used. Methods of detecting a battery remaining capacity are a method of measuring charging/discharging currents (See Japanese Patent Application Laid-open No. Hei 5-66251, Japanese Patent Application Laid-open No. Hei 7-260839, for example) and a method of measuring a battery voltage (See Japanese Patent Application Laid-open No. Hei 6-51876, Japanese Patent Application Laid-open No. Hei 11-55372, for example).

However, the method of measuring the charging/discharging currents requires a current measurer, a storage to store data on a measured current, and a CPU to calculate a battery remaining capacity from the data, which hinders size reduction and cost reduction. Hence, it is not suitable for the small-sized information terminal.

On the other hand, in the method of measuring the battery voltage, because of a battery characteristic, the external voltage changes according to internal impedance when the load changes. Therefore, in the information terminal with a built-in unit having large load change, a precise battery remaining capacity cannot be detected. For example, the following situation occurs: When the information terminal is powered on, the load increases, and thereby the battery remaining capacity is displayed at a low value, and when the information terminal is stabilized thereafter, the load decreases, and thereby the battery remaining capacity increases. Such a change in the display of the battery remaining capacity is confusing and very inconvenient to the users.

A method of correcting the influence of load change is a method of measuring a current flowing through a load and correcting it as disclosed in Japanese Patent Application Laid-open No. Hei 5-66251. However, additional components such as a current detector and a comparison voltage corrector become necessary, which causes cost increase. Moreover, the information terminal, for which size reduction is indispensable, needs to avoid the addition of new components for the purpose of detecting the battery remaining capacity as much as possible. Further, the insertion of a resistance for detecting the current into a power supply line causes a drop in voltage and wasteful power consumption, and hence it is not suitable for the information terminal which requires the longest possible time driven by the battery.

Furthermore, the hard disk drive is accessed regularly at certain time intervals while the information terminal is reproducing moving images or sound or playing a slide show, and hence the load on the battery changes greatly at the certain time intervals. Namely, the load while the hard disk drive is being accessed and the load while the hard disk drive is not accessed are very different, and along with this, the load current also changes. Therefore, there is a problem that the battery remaining capacity is difficult to display precisely while the information terminal is reproducing and playing the slide show or the like.

SUMMARY OF THE INVENTION

Hence, the present invention is made in view of the aforementioned problems, and an object of the present invention is to reduce the size of an information terminal while the display of a battery remaining capacity after the influence of load change is corrected is enabled. Another object of the present invention is to be able to calculate the battery remaining capacity as precisely as possible by calculating the battery remaining capacity excluding a period of time when a hard disk drive is accessed.

In order to accomplish the aforementioned and other objects, according to one aspect of the present invention, an information terminal driven by a battery, comprises:

a voltage detector configured to detect a battery voltage which is a voltage of the battery;

a drive unit configured to be driven upon receiving a supply of a power source from the battery;

a load calculator configured to calculate a load on the battery of the drive unit; and a battery remaining capacity calculator configured to calculate a battery remaining capacity based on the battery voltage, the battery remaining capacity calculator calculating the battery remaining capacity corrected based on the load calculated by the load calculator.

According to another aspect of the present invention, a battery remaining capacity calculating method in an information terminal driven by a battery, comprises the steps of:

detecting a battery voltage which is a voltage of the battery;

calculating a load on the battery of a drive unit which is driven upon receiving a supply of a power source from the battery; and in calculating a battery remaining capacity based on the battery voltage, calculating the battery remaining capacity corrected based on the calculated load.

According to another aspect of the present invention, a recording medium has a program for causing an information terminal driven by a battery to calculate a battery remaining capacity recorded thereon, and the program causes the information terminal to execute process comprising the steps of:

detecting a battery voltage which is a voltage of the battery;

calculating a load on the battery of a drive unit which is driven upon receiving a supply of a power source from the battery; and in calculating a battery remaining capacity based on the battery voltage, calculating the battery remaining capacity corrected based on the calculated load.

According to another aspect of the present invention, an information terminal driven by a battery, comprises:

a data storage configured to be driven upon receiving a supply of a power source from the battery, data being stored in the data storage;

a voltage detector configured to detect a battery voltage which is a voltage of the battery;

a battery remaining capacity calculator configured to calculate a battery remaining capacity based on the battery voltage, the battery remaining capacity calculator calculating the battery remaining capacity after access to the data storage is completed.

According to another aspect of the present invention, an information terminal driven by a battery, comprises:

a data storage configured to be driven upon receiving a supply of a power source from the battery and store data;

a data storage load calculator configured to calculate a load of the data storage;

a voltage detector configured to detect a battery voltage which is a voltage of the battery; and a battery remaining capacity calculator configured to calculate a battery remaining capacity based on the battery voltage, the battery remaining capacity calculator calculating the battery remaining capacity when the load of the data storage calculated by the data storage load calculator is lower than a given value.

According to another aspect of the present invention, a battery remaining capacity calculating method in an information terminal driven by a battery, comprises the steps of:

judging whether access to a data storage is completed, the data storage being driven upon receiving a supply of a power source from the battery; and calculating a battery remaining capacity based on a battery voltage which is a voltage of the battery after the access to the data storage is completed.

According to another aspect of the present invention, a battery remaining capacity calculating method in an information terminal driven by a battery, comprises the steps of:

calculating a load of a data storage which is driven upon receiving a supply of a power source from the battery; and calculating a battery remaining capacity based on a battery voltage which is a voltage of the battery when the calculated load is lower than a given value.

According to another aspect of the present invention, a recording medium has a program for causing an information terminal driven by a battery to calculate a battery remaining capacity recorded thereon, and the program causes the information terminal to execute process comprising the steps of:

judging whether access to a data storage is completed, the data storage being driven upon receiving a supply of a power source from the battery; and calculating a battery remaining capacity based on a battery voltage which is a voltage of the battery after the access to the data storage is completed.

According to another aspect of the present invention, a recording medium has a program for causing an information terminal driven by a battery to calculate a battery remaining capacity recorded thereon, wherein the program causes the information terminal to execute process comprising the steps of:

calculating a load of a data storage which is driven upon receiving a supply of a power source from the battery; and calculating a battery remaining capacity based on a battery voltage which is a voltage of the battery when the calculated load is lower than a given value.

BRIEF DESCRIPTION OF THE DRAWINGS

FIG. 4 is a diagram showing an example of a 5° C. voltage-remaining capacity conversion table included in the information terminal according to the first embodiment and the second embodiment;

FIG. 6 is a diagram showing an example of a 25° C. voltage-remaining capacity conversion table included in the information terminal according to the first embodiment and the second embodiment;

FIG. 7 is a diagram showing an example of a 45° C. voltage-remaining capacity conversion table included in the information terminal according to the first embodiment and the second embodiment;

FIG. 8 is a diagram showing an example of a 20° C. voltage-remaining capacity conversion table generated from the 15° C. voltage-remaining capacity conversion table shown in FIG. 5 and the 25° C. voltage-remaining capacity conversion table shown in FIG. 6;

FIG. 10 is a diagram showing a table representing a relation between an operating state of a hard disk drive and its current consumption in the information terminal according to the second embodiment;

FIG. 18 is a diagram showing an example of calculation of a constant load according to the processing contents of the information terminal;

DETAILED DESCRIPTION OF THE EMBODIMENTS

First Embodiment

In this embodiment, in a small-sized information terminal with a built-in unit having large load change, it is possible to, in calculating a battery remaining capacity, correct the influence of the load change and acquire a battery remaining capacity with high precision. Further details will be given below.

Figure 1:
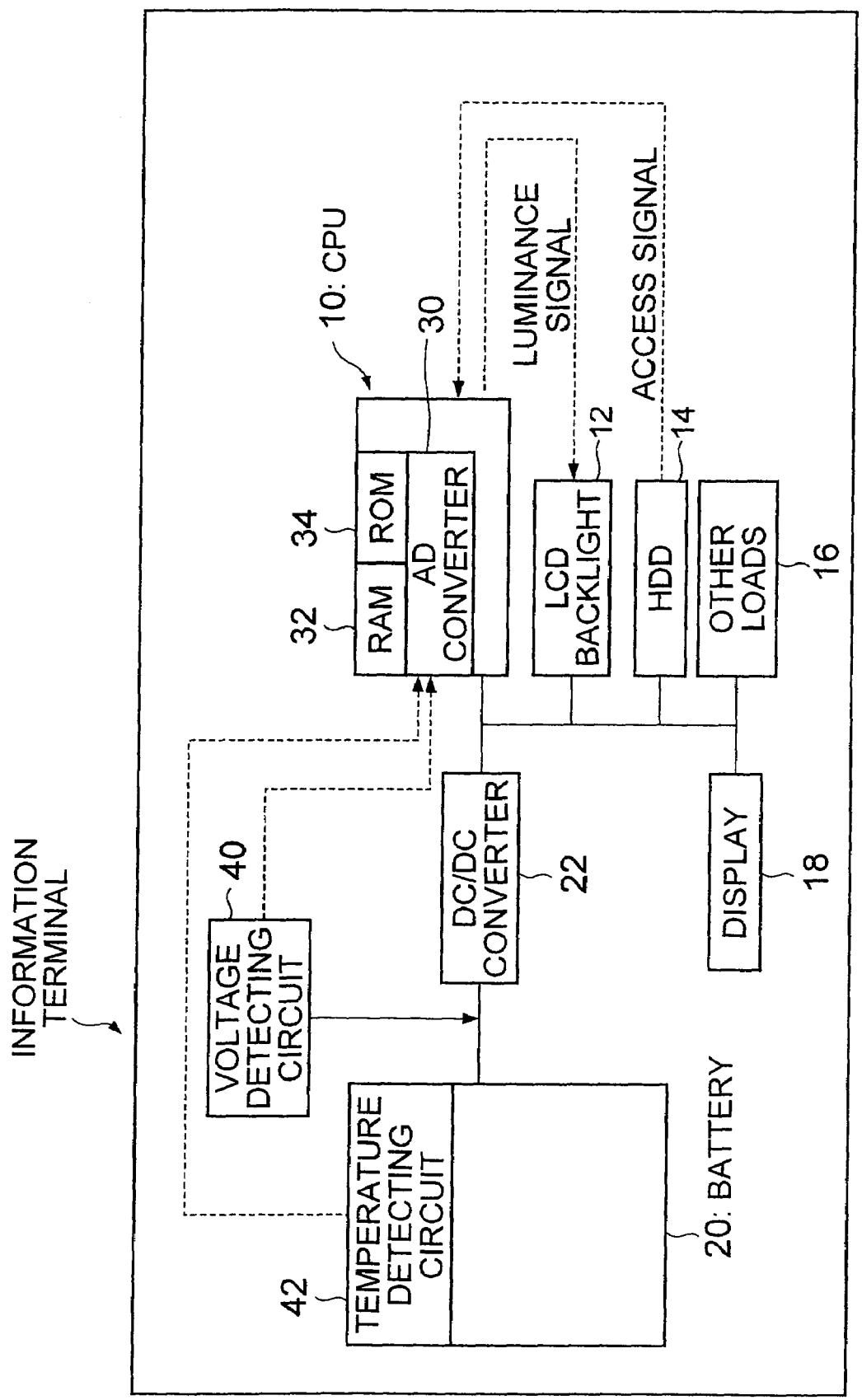
FIG. 1 is a block diagram showing an example of the configuration of an information terminal according to a first embodiment.

FIG. 1 is a block diagram showing an example of the internal configuration of the information terminal according to this embodiment. As shown in FIG. 1, the information terminal includes a CPU 10, an LCD backlight 12, a hard disk drive 14, a display 18, and loads 16 other than these. This information terminal has a built-in battery 20, and a power source supplied from the battery 20 is supplied to the CPU 10, the LCD backlight 12, the hard disk drive 14, the display 18, and the other loads 16 via a DC/DC converter 22. Namely, a voltage stabilized or transformed by the DC/DC converter 22 is supplied to a drive being a load thereof. The CPU 10 includes therein an AD converter 30, a RAM 32, and a ROM 34. This CPU 10 composes a central processing unit in this embodiment.

This information terminal also includes a voltage detecting circuit 40. This voltage detecting circuit detects a voltage between the battery 20 and the DC/DC converter 22, and a detected value is supplied as a battery voltage to the AD converter 30 of the CPU 10. This detected valued is converted into digital data and incorporated into the CPU 10.

The battery 20 has a built-in temperature detecting circuit 42. This temperature detecting circuit 42 is, for example, composed of a thermistor, and an output of an analog signal from the temperature detecting circuit 42 is inputted to the AD converter 30 and incorporated as digital data into the CPU 10.

Figure 2:
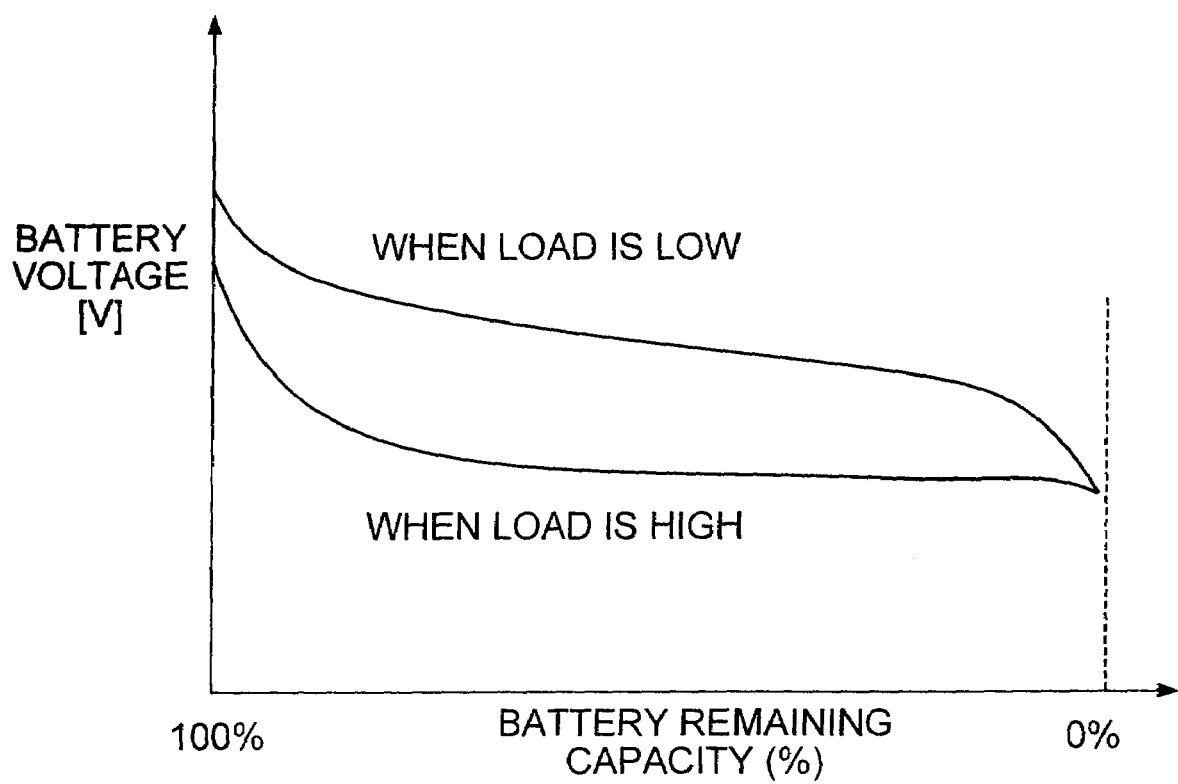
FIG. 2 is a graph showing a relation between a battery voltage and a battery remaining capacity.

Next, the principle of battery remaining capacity calculation according to this embodiment will be described based on FIG. 2. FIG. 2 is a graph showing a relation between a battery voltage and a battery remaining capacity when the load is high (1200 mA, for example) and when the load is low (400 mA, for example). As can be seen from this graph, even if measured battery voltages have the same value, actual battery remaining capacities differ when the load is high and when the load is low. Hence, in this embodiment, relations between the battery voltage and the battery remaining capacity with respect to some representative load values are previously prepared by tables. In finding a battery remaining capacity, a load of the information terminal concerned is calculated, and by performing a correction according to the load when the battery remaining capacity is found based on a measured battery voltage, the more precise battery remaining capacity can be calculated.

Figure 3:
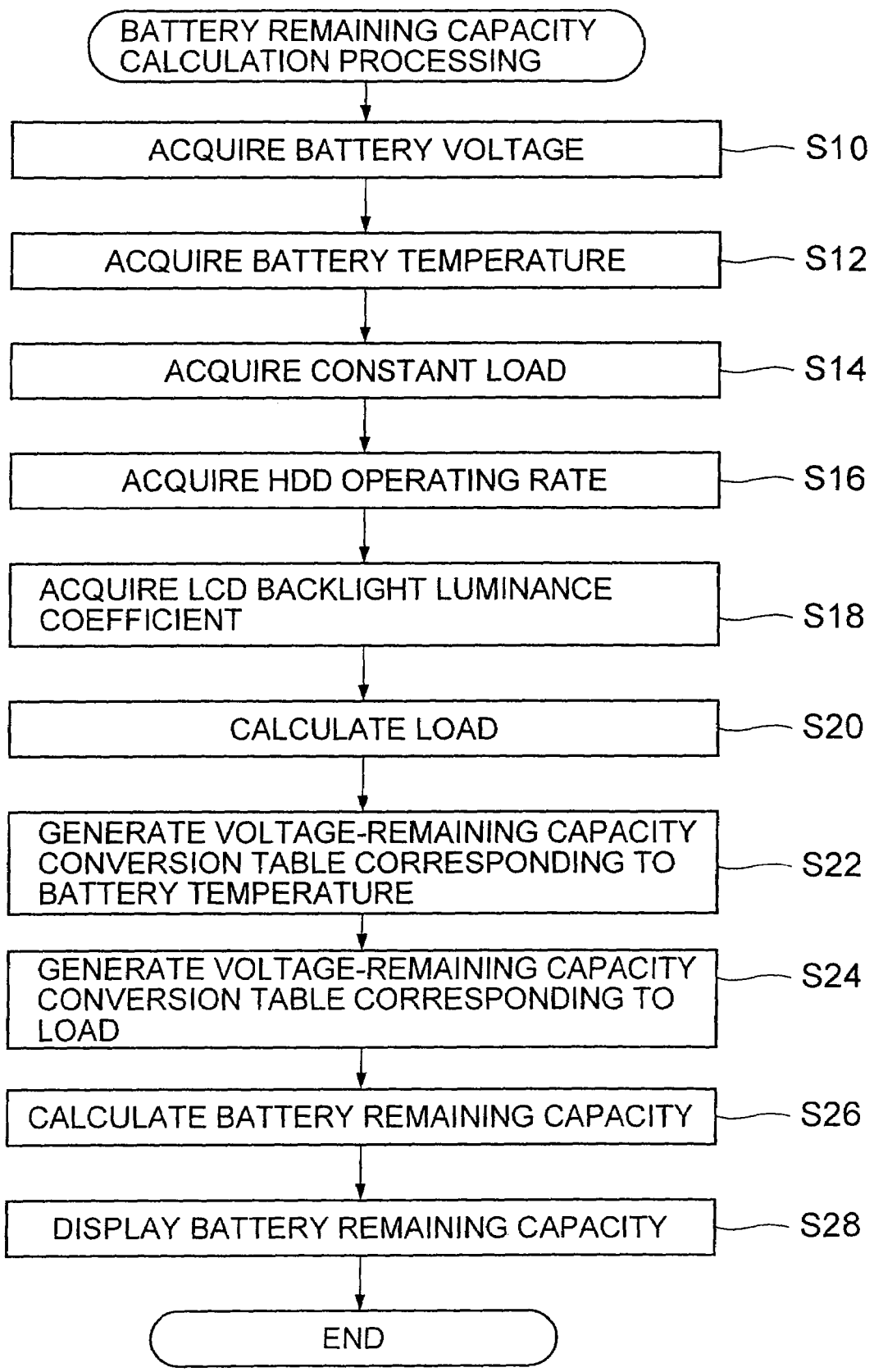
FIG. 3 is a flowchart explaining the contents of battery remaining capacity calculation processing according to the first embodiment and the contents of a part of battery remaining capacity calculation processing according to a second embodiment.

FIG. 3 is a flowchart explaining the contents of battery remaining capacity calculation processing according to this embodiment. This battery remaining capacity calculation processing shown in FIG. 3 is realized by making the CPU 10 read and execute a battery remaining capacity calculation processing program stored in the ROM 34.

As shown in FIG. 3, the information terminal acquires a battery voltage which is a voltage of the battery 20 (step S10). Namely, the voltage of the battery 20 detected by the voltage detecting circuit 40 is acquired as digital data via the AD converter 30.

Then, the information terminal acquires a battery temperature which is a temperature of the battery 20 (step S12). Namely, the battery temperature as analog data detected by the temperature detecting circuit 42 provided in the battery 20 is acquired as digital data via the AD converter 30.

Thereafter, the information terminal acquires a constant load (step S14). This constant load changes according to the operation mode of the CPU 10. In this embodiment, it is assumed that the CPU 10 has three operation modes: low-speed, medium-speed, and high-speed operation modes. The CPU 10 keeps track of in which mode out of these three operation modes the CPU 10 is at the moment. In this embodiment, the constant load is 400 mA in the low-speed mode, the constant load is 500 mA in the medium-speed mode, and the constant load is 600 mA in the high-speed mode.

Subsequently, the information terminal acquires a hard disk drive operating rate (step S16). In this embodiment, the hard disk drive 14 outputs an access signal which indicates whether it is accessed or not to the CPU 10. Therefore, the CPU 10 can acquire this access signal and calculate a ratio between a period of time when the hard disk drive 14 is accessed and a period of time when it is not accessed at any time. In this embodiment, this access period ratio is defined as the hard disk drive operating rate.

Then, the information terminal acquires an LCD backlight luminance coefficient (step S18). In this embodiment, the CPU 10 outputs a luminance signal which controls the luminance of the LCD backlight 12 to the LCD backlight 12. Hence, the CPU 10 can keep track of a luminance coefficient of the LCD backlight 12 based on this luminance. In this embodiment, the LCD backlight luminance coefficient can be set between 0% and 100% in steps of 10%.

Thereafter, the information terminal calculates a load (step S20). In this embodiment, the load is found by the following expression (1).

load=constant load+hard disk drive access load×hard disk drive operating rate+LCD load×LCD backlight luminance coefficient (1)

In this embodiment, it is assumed that the hard disk drive access load is, for example, 500 mA, and the LCD load is, for example, 100 mA. By substituting the constant load acquired in step S14, the hard disk drive operating rate acquired in step S16, and the LCD backlight luminance coefficient acquired in step S18 into this expression, a current load can be calculated.

Figure 5:
FIG. 5 is a diagram showing an example of a 15° C. voltage-remaining capacity conversion table included in the information terminal according to the first embodiment and the second embodiment.

Subsequently, the information terminal generates a voltage-remaining capacity conversion table which corresponds to the battery temperature (step S22). In this embodiment, four kinds of voltage-remaining capacity conversion tables according to temperature are stored in ROM 34 in the CPU 10. FIG. 4 to FIG. 7 are diagrams showing an example of these four kinds of voltage-remaining capacity conversion tables TB10 to TB40 according to temperature. FIG. 4 is a diagram showing the voltage-remaining capacity conversion table TB10 when the battery temperature is 5° C., FIG. 5 is a diagram showing the voltage-remaining capacity conversion table TB20 when the battery temperature is 15° C., FIG. 6 is a diagram showing the voltage-remaining capacity conversion table TB30 when the battery temperature is 25° C., and FIG. 7 is a diagram showing the voltage-remaining capacity conversion table TB40 when the battery temperature is 45° C.

As can be seen from these figures, in this embodiment, the relation between the remaining capacity and the battery voltage is tabulated with three loads of 400 mA, 800 mA, and 1200 mA as representative values. Using these voltage-remaining capacity conversion tables, a voltage-remaining capacity conversion table at the battery temperature acquired in step S12 is generated by line interpolation.

For example, it is assumed that the battery temperature acquired in step S12 is 20° C. In this case, by linearly interpolating voltage values in the 15° C. voltage-remaining capacity conversion table TB20 shown in FIG. 5 and voltage values in the 25° C. voltage-remaining capacity conversion table TB30 shown in FIG. 6, voltage values in a 20° C. voltage-remaining capacity conversion table are generated. More specifically, a voltage Y after correction can be calculated by the following expression (2)

$$Y = \frac{(Y2 - Y1)}{(T2 - T1)}(T - T1) + Y1 \quad \text{where } T1 < T2 \quad (2)$$

where T1 (15° C.) is the temperature of the low-temperature side voltage-remaining capacity conversion table, T2 (25° C.) is the temperature of the high-temperature side voltage-remaining capacity conversion table, T (20° C.) is the battery temperature, Y1 is a voltage value at T1, and Y2 is a voltage value at T2.

Consequently, the voltage-remaining capacity conversion table TB50 when the calculated battery temperature is 20° C. is as shown in FIG. 8. This voltage-remaining capacity conversion table TB50 is stored in the RAM 32 of the CPU 10.

Incidentally, in this embodiment, by using the 5° C. and 15° C. voltage-remaining capacity conversion tables when the battery temperature is lower than 5° C. and using the 25° C. and 45° C. voltage-remaining capacity conversion tables when the battery temperature is higher than 45° C., and substituting corresponding values into the expression (2), voltage-remaining capacity conversion tables at these temperatures can be obtained.

Then, as shown in FIG. 3, the information terminal generates a voltage-remaining capacity conversion table corresponding to the load calculated in step S20 (step S24). Namely, based on the voltage-remaining capacity conversion table generated in step S22, the voltage-remaining capacity conversion table corresponding to the load calculated in step S20 is generated and stored in the RAM 32.

For example, it is assumed that the load calculated in step S20 is 1000 mA. In this case, by linearly interpolating voltage values at 800 mA and voltage values at 1200 mA in the voltage-remaining capacity conversion table TB50 shown in FIG. 8, voltage values in a 1000 mA voltage-remaining capacity conversion table TB60 are generated. More specifically, a voltage Y after correction can be calculated by the following expression (3)

$$Y = \frac{(Y2 - Y1)}{(L2 - L1)}(L - L1) + Y1 \quad \text{where } L1 < L2 \quad (3)$$

where L1 (800 mA) is a low-load side current value, L2 (1200 mA) is a high-load side current value, L is the load calculated in step S20, Y1 is a voltage value at L1, and Y2 is a voltage value at L2.

Figure 9:
FIG. 9 is a diagram showing an example of a 1000 mA voltage-remaining capacity conversion table generated from the 20° C. voltage-remaining capacity conversion table shown in FIG. 8.

Consequently, the voltage-remaining capacity conversion table TB60 when the calculated load is 1000 mA is as shown in FIG. 9.

Thereafter, as shown in FIG. 3, the information terminal calculates a battery remaining capacity based on the voltage-remaining capacity conversion table TB60 after the load is corrected and the temperature is corrected (step S26). Namely, by linearly interpolating numerical values in the voltage-remaining capacity conversion table TB60 stored in the RAM 32, a battery remaining capacity corresponding to the battery voltage acquired in step S10 is calculated.

For example, it is assumed that the battery voltage acquired in step S10 is 3.55 V In this case, by linearly interpolating 3.54 V (battery remaining capacity of 40%) and 3.60 V (battery remaining capacity of 50%) in the voltage-remaining capacity conversion table TB60 shown in FIG. 9, the battery remaining capacity when the battery voltage is 3.55 V is calculated. More specifically, a battery remaining capacity X after correction can be calculated by the following expression (4)

$$Y = \frac{(X2 - X1)}{(Y2 - Y1)}(Y - Y1) + X1 \quad \text{where } Y1 < Y2 \quad (4)$$

where Y1 (3.54 V) is a low-voltage side voltage value, Y2 (3.60 V) is a high-voltage side voltage value, Y is the voltage acquired in step S10, X1 is a battery remaining capacity at Y1, and X2 is a battery remaining capacity at Y2.

Consequently, the result of calculation of the battery remaining capacity is approximately 42%. In this embodiment, this calculated battery remaining capacity is temporarily stored in the RAM 32.

Thereafter, as shown in FIG. 3, the information terminal reads the calculated battery remaining capacity from the RAM 32 and displays it on the display 18 (step S28). Various methods of displaying the battery remaining capacity are thought out. For example, with a screen of the information terminal as the display 18, 42% may be displayed numerically, or with a bar-form liquid crystal display as the display 18, a bar of this liquid crystal display may have a length corresponding to 42%.

As described above, according to this embodiment, the operating rate of a unit (for example, the hard disk drive 14, the LCD backlight 12, the operation mode of the CPU 10, or the like) which greatly contributes to load change is calculated by measuring a signal which the unit outputs or a signal which the unit receives, and by making a correction based on the calculated result, the battery remaining capacity is displayed with high precision. Moreover, the correction is made using the CPU 10 which is originally built in the information terminal, whereby the addition of a new unit is not necessary, which can realize size reduction and cost reduction of the information terminal.

Further, the battery temperature of the battery 20 is detected using the temperature detecting circuit 42, the correction is further made based on this battery temperature, and consequently the battery remaining capacity can be displayed with higher precision.

Second Embodiment

In the aforementioned first embodiment, by calculating the hard disk drive operating rate based on the access signal of the hard disk drive 14, the load of the hard disk drive 14 is calculated, but in the second embodiment, by specifying the state of the hard disk drive 14 more precisely, the load of the hard disk drive 14 is found more precisely.

Figure 11:
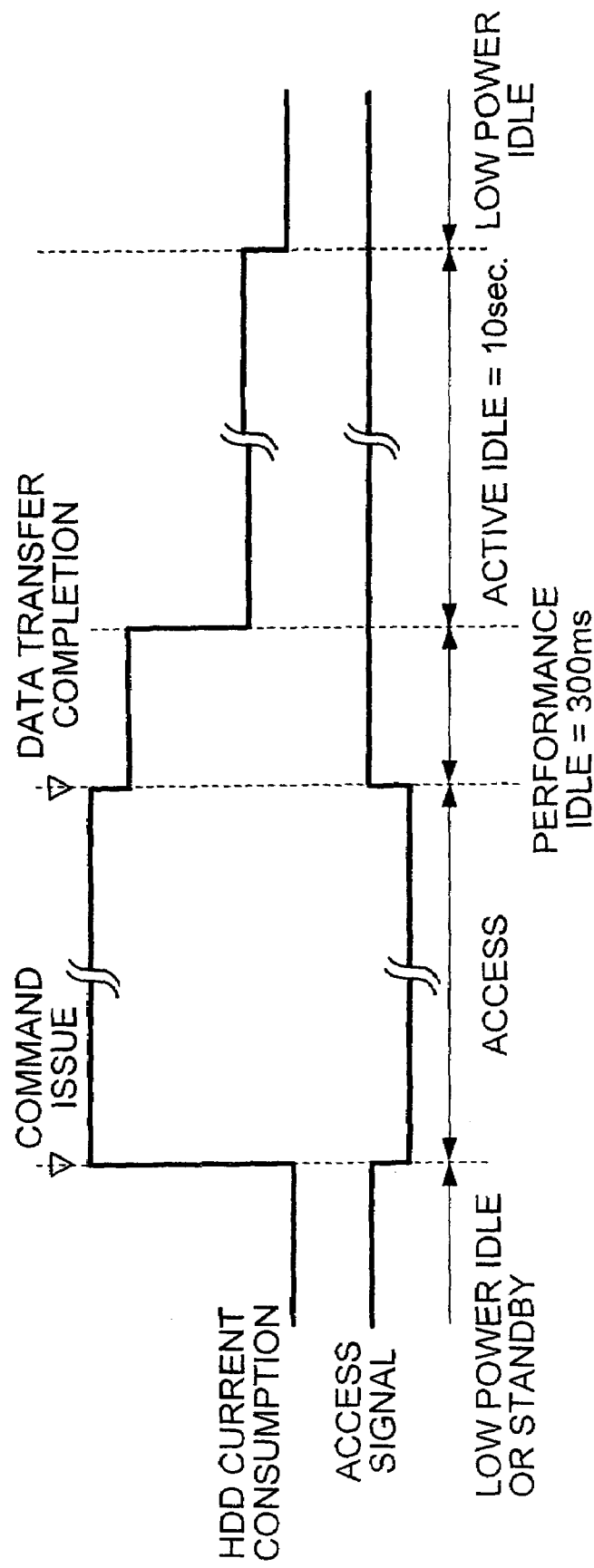
FIG. 11 is a diagram showing an example of the transition of the operating state of the hard disk drive and its current consumption in the information terminal according to the second embodiment.

More specifically, the hard disk drive 14 in this embodiment has five operating states as shown in FIG. 10 and FIG. 11. Namely, it has an access state (hereinafter called an AC load) where the hard disk drive 14 is actually being accessed, a performance idle state (hereinafter called a PI load) for 300 ms after the completion of the access, an active idle state (hereinafter called an AI load) for 10 seconds after the completion of the performance idle state, a low power idle state (hereinafter called a LPI load) after the completion of the active idle state, and a standby state (hereinafter called an ST load) to which the hard disk drive 10 shifts based on an instruction from the CPU 10 as its operating states.

In this embodiment, the current consumption in the access state is 600 mA, the current consumption in the performance idle state is 400 mA, the current consumption in the active idle state is 190 mA, the current consumption in the low power idle state is 170 mA, and the current consumption in the standby state is 40 mA. Incidentally, in this embodiment, the state of the hard disk drive 14 is sampled 32 times per second. In other words, the operating state of the hard disk drive 14 is specified in a sampling cycle of 31.25 ms.

Moreover, the access signal in the first embodiment goes low when the hard disk drive 14 is in the access state, and goes high when it is not in the access state.

Accordingly, in this embodiment, even when the access signal indicates the state where the hard disk drive 14 is not accessed, the current consumption differs greatly according to whether the hard disk drive 14 is in the performance idle state, the active idle state, the low power idle state, or the standby state. Hence, the precise load of the hard disk drive 14 cannot be calculated by only detecting a low level and a high level of the access signal and counting them.

Figure 12:
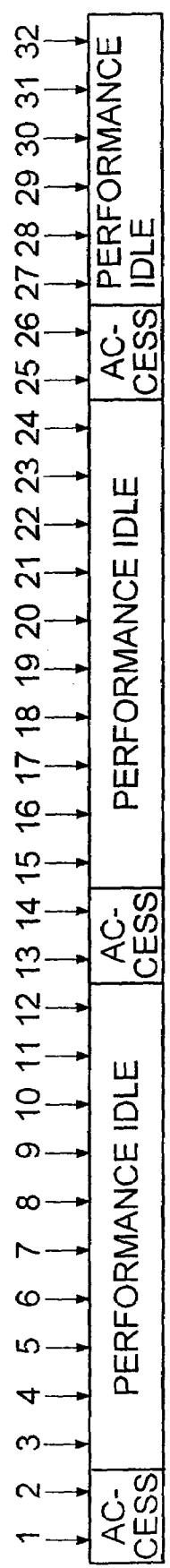
FIG. 12 is a diagram showing an example of the transition of the operating state of the hard disk drive in the information terminal according to the second embodiment.
Figure 13:
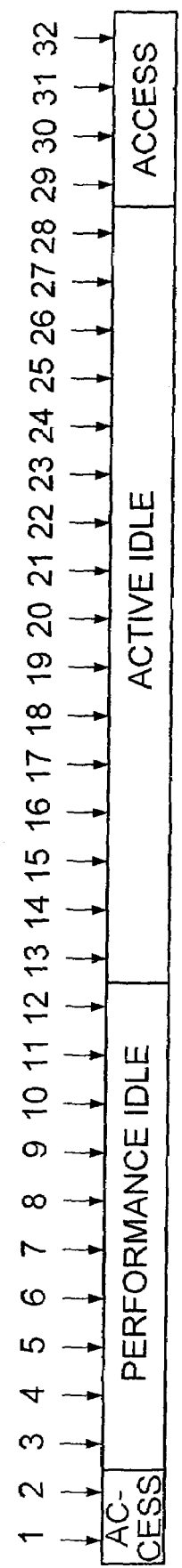
FIG. 13 is a diagram showing an example of the transition of the operating state of the hard disk drive in the information terminal according to the second embodiment.

This is obvious, for example, if a case where the hard disk drive 14 shifts in order of the access state, the performance idle state, the access state, the performance idle state, the access state, and the performance idle state as shown in FIG. 12 and a case where the hard disk drive 14 shifts in order of the access state, the performance idle state, the active idle state, and the access state as shown in FIG. 13 are compared.

In FIG. 12 and FIG. 13, the numbers of low-level access signals (that is, access states) counted per second are the same, that is, six. However, the load of the hard disk drive 14 is 438 mA in the case of FIG. 12 and 333 mA in the case of FIG. 13, and the difference between them is as large as 105 mA. This value exists as a latent error when the load of the hard disk drive 14 is calculated based on only the access signal indicating whether the hard disk drive 14 is accessed or not.

Hence, in this embodiment, the load of the hard disk drive 14 is calculated using the following expression (5).

$$\text{load of hard disk drive} = AC\,\text{load} \times (N\_ON/32) + PI\,\text{load} \times (N\_OFF\_PI/32) + AI\,\text{load} \times (N\_OFF\_AI/32) + LPI\,\text{load} \times (N\_OFF\_LPI/32) + ST\,\text{load} \times (N=OFF\_PI/32) \quad (5)$$

Namely, since 32 samplings per second are performed, the current consumption per second of the hard disk drive 14 is calculated based on states obtained by the samplings. Here, a counter N_ON is the number of access states of the hard disk drive 14 counted during immediately preceding one second, a counter N_OFF_PI is the number of performance idle states of the hard disk drive 14 counted during the immediately preceding one second, a counter N_OFF_AI is the number of active idle states of the hard disk drive 14 counted during the immediately preceding one second, a counter N_OFF_LPI is the number of low power idle states of the hard disk drive 14 counted during the immediately preceding one second, and a counter N_OFF_ST is the number of standby states of the hard disk drive 14 counted during the immediately preceding one second. Namely, the counters N_ON, N_OFF_PI, N_OFF_AI, N_OFF_LPI, and N_OFF_ST are variables which are cleared to zero every one second.

Incidentally, as concerns the standby state (ST load), the hard disk drive 14 is shifted thereto by an instruction from the CPU 10 to the hard disk drive 14, so that the CPU 10 itself can specify this standby state.

Moreover, a load of the entire information terminal is calculated by an expression (6) in place of the expression (1) in the first embodiment.

$$\text{load} = \text{constant load} + \text{load of hard disk drive} + \text{LCD load} \times \text{LCD backlight luminance coefficient} \quad (6)$$

Figure 14:
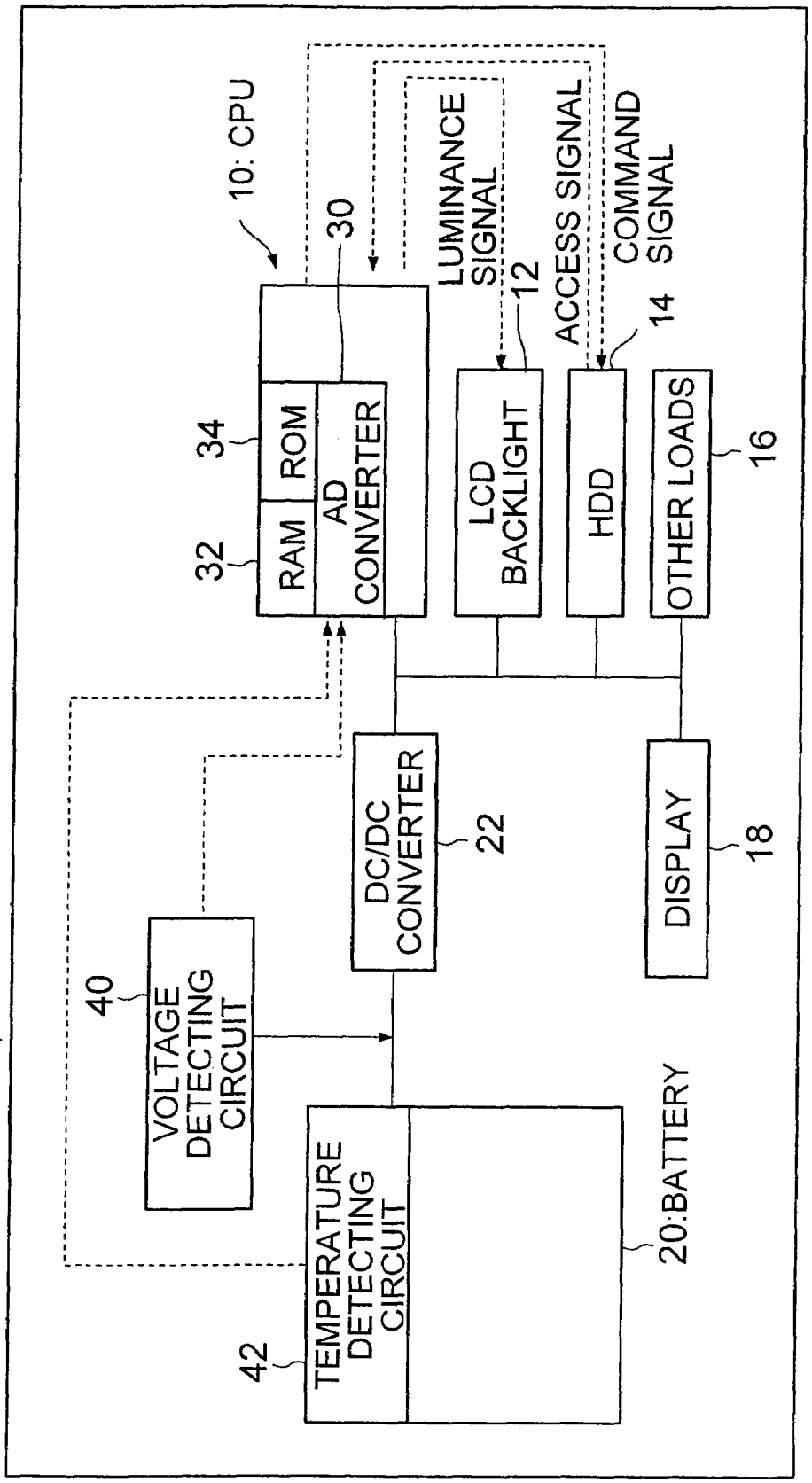
FIG. 14 is a block diagram showing an example of the configuration of the information terminal according to the second embodiment.

FIG. 14 is a block diagram showing an example of the internal configuration of an information terminal according to this embodiment. As can be seen from FIG. 14, the internal configuration of the information terminal according to this embodiment is schematically the same as that in the aforementioned first embodiment, but different in that a command signal which causes the hard disk drive 14 to shift to the standby state is outputted from the CPU 10 to the hard disk drive 14. Namely, in this embodiment, the CPU 10 positively causes the hard disk drive 14 to shift to the standby state, and thereby the command signal is outputted from the CPU 10 to the hard disk drive 14. Normally, the command signal which causes the hard disk drive 14 to shift to the standby state is outputted when the hard disk drive 14 is in the low power idle state. The other configuration is the same as that in the aforementioned first embodiment.

Figure 15:
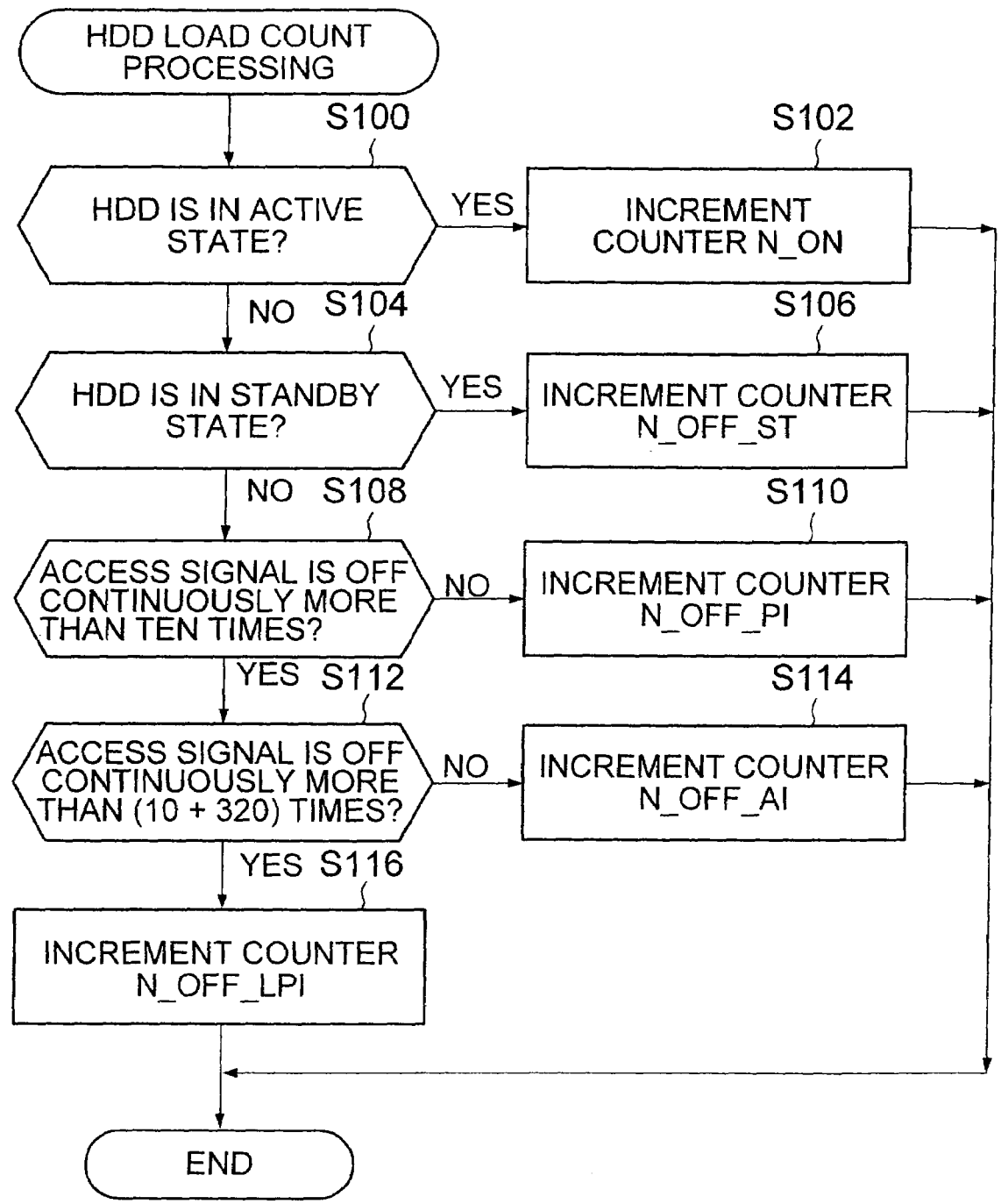
FIG. 15 is a flowchart explaining the contents of hard disk drive load count processing according to the second embodiment.

Next, hard disk drive load count processing in this embodiment will be explained. FIG. 15 is a flowchart explaining the contents of the hard disk drive load count processing according to this embodiment. The hard disk drive load count processing shown in FIG. 15 is realized by making the CPU 10 read and execute a hard disk drive load count processing program stored in the ROM 34. This hard disk drive load count processing is started every 31.25 ms to make a count as described above.

As shown in FIG. 15, the information terminal judges whether the hard disk drive 14 is in the active state (step S100). More specifically, the information terminal judges whether the access signal of the hard disk drive 14 indicates the access state. When the hard disk drive 14 is in the active state (step S100: Yes), the counter N_ON is incremented by one (step S102).

On the other hand, when the hard disk drive 14 is not in the active state (step S100: No), it is judged whether the hard disk drive 14 is in the standby state (step S104). More specifically, since the CPU 10 outputs the command signal to shift the hard disk drive 14 to the standby state to the hard disk drive 14, the CPU 10 can keep track of whether the hard disk drive 14 is in the standby state. Therefore, the CPU 10 itself judges whether it has brought the hard disk drive into the standby state. When the hard disk drive 14 is in the standby state (step S104: Yes), the counter N_OFF_ST is incremented by one (step S106).

On the other hand, when it is judged that the hard disk drive 14 is not in the standby state (step S104: No), it is judged whether the access signal is in a non-access state continuously in more than 10 times of samplings (step S108). More specifically, the CPU 10 performs processing in which when the CPU 10 starts counting the number of continuous non-accesses from zero immediately after the access signal shifts from the access state (low level) to the non-access state (access level) and the non-access state is continued at the time of sampling, the number of continuous non-accesses is incremented by one.

Then, the CPU 10 judges whether the number of continuous non-accesses is more than 10. As described above, in this embodiment, the performance idle state is set to continue for 300 ms if there is no access. Therefore, in this embodiment in which sampling is performed every 31.25 ms, the period of time of the performance idle state corresponds to the period of time of 10 samplings, so that when the number of times the access signal indicating the non-access state is continuously sampled is 10 or less, the hard disk drive 14 can be judged to be in the performance idle state.

When the number of continuous non-accesses is 10 or less (step S108: No), the counter N_OFF_PI is incremented by one (step S110).

On the other hand, when the number of continuous non-accesses is more than 10 (step S108: Yes), it is judged whether the number of continuous non-accesses is more than 10+320=330 (step S112). More specifically, the CPU 10 judges whether the number of continuous non-accesses is more than 330. As described above, in this embodiment, the performance idle state is set to continue for 300 ms, and the active idle state is set to continue for 10 seconds thereafter. Therefore, in this embodiment in which sampling is performed every 31.25 ms, the period of time of the performance idle state corresponds to the period of time of 10 samplings and the period of the active idle state corresponds to the period of time of 320 samplings, so that when the number of continuous non-accesses which indicates the number of times the non-access state is continuously sampled is more than 10 and 330 or less, the hard disk drive 14 can be judged to be in the active idle state. When the number of continuous non-accesses is 330 or less (step S112: No), the counter N_OFF_AI is incremented by one (step S114).

On the other hand, when the number of continuous non-accesses is more than 330 (step S112: Yes), the counter N_OFF_LPI is incremented by one (step S116).

By the aforementioned processing in step S102, step S106, step S110, step S114, or step S116, the hard disk drive load count processing is ended.

Figure 16:
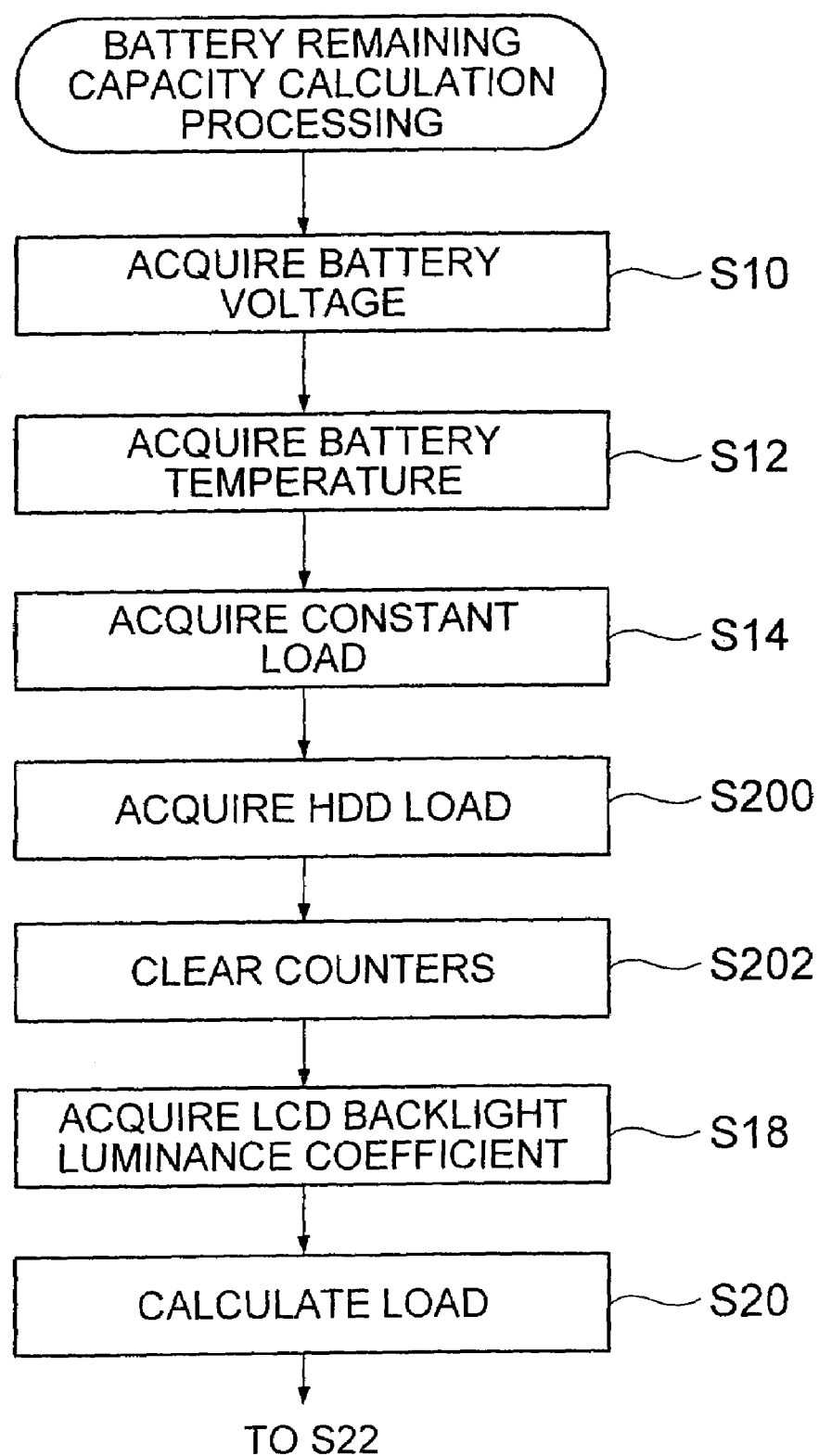
FIG. 16 is a flowchart explaining the contents of a part of the battery remaining capacity calculation processing according to the second embodiment.

Next, battery remaining capacity calculation processing in this embodiment will be explained. FIG. 16 is a flowchart explaining the contents of the battery remaining capacity calculation processing according to this embodiment. This battery remaining capacity calculation processing shown in FIG. 16 is realized by making the CPU 10 read and execute a battery remaining capacity calculation processing program stored in the ROM 34. In this embodiment, this battery remaining capacity calculation processing is started once per second.

As shown in FIG. 16, the information terminal acquires a battery voltage which is a voltage of the battery 20 (step S110). Namely, the voltage of the battery 20 detected by the voltage detecting circuit 40 is acquired as digital data via the AD converter 30.

Then, the information terminal acquires a battery temperature which is a temperature of the battery 20 (step S12). Namely, the battery temperature as analog data detected by the temperature detecting circuit 42 provided in the battery 20 is acquired as digital data via the AD converter 30.

Thereafter, the information terminal acquires a constant load (step S14).

This constant load changes according to the operation mode of the CPU 10. In this embodiment, it is assumed that the CPU 10 has three operation modes: low-speed, medium-speed, and high-speed operation modes. The CPU 10 keeps track of in which mode out of these three operation modes the CPU 10 is at the moment. In this embodiment, the constant load is 400 mA in the low-speed mode, the constant load is 500 mA in the medium-speed mode, and the constant load is 600 mA at the high-speed mode.

Subsequently, the information terminal acquires a load of the hard disk drive 14 (step S200). In this embodiment, the load of the hard disk drive 14 is calculated based on the aforementioned expression (5). Namely, the load of the hard disk drive 14 is calculated based on the result of samplings of the state of the hard disk drive 14 during the immediately preceding one second by the hard disk drive load count processing. More specifically, by substituting the count number of N_ON, the count number of N_OFF PI, the count number of N_OFF_AI, the count number of N_OFF_LPI, and the count number of N_OFF_ST into the expression (5), the current load of the hard disk drive 14 can be calculated.

Then, these counters N_ON, N_OFF_PI, N_OFF_AI, N_OFF_LPI, and N_OFF_ST are cleared and set to zero (step S202).

Thereafter, the information terminal acquires an LCD backlight luminance coefficient (step S18). In this embodiment, the CPU 10 outputs a luminance signal which controls the luminance of the LCD backlight 12 to the LCD backlight 12. Hence, the CPU 10 can keep track of a luminance coefficient of the LCD backlight 12 based on this luminance. In this embodiment, the LCD backlight luminance coefficient can be set between 0% and 100% in steps of 10%.

Subsequently, the information terminal calculates a whole load (step S20). In this embodiment, the whole load is calculated based on the aforementioned expression (6). The processing after this is the same as that in the aforementioned first embodiment, and hence the explanation thereof is omitted. Moreover, the voltage-remaining capacity conversion tables TB10 to TB40 according to temperature included in the information terminal of this embodiment are the same as those in FIG. 4 to FIG. 7 in the aforementioned first embodiment, and hence the explanation thereof is omitted.

As described above, according to this embodiment, the load of the hard disk drive 14 is calculated with higher precision based on the operating states of the hard disk drive 14. Consequently, the battery remaining capacity can be displayed with higher precision.

Figure 17:
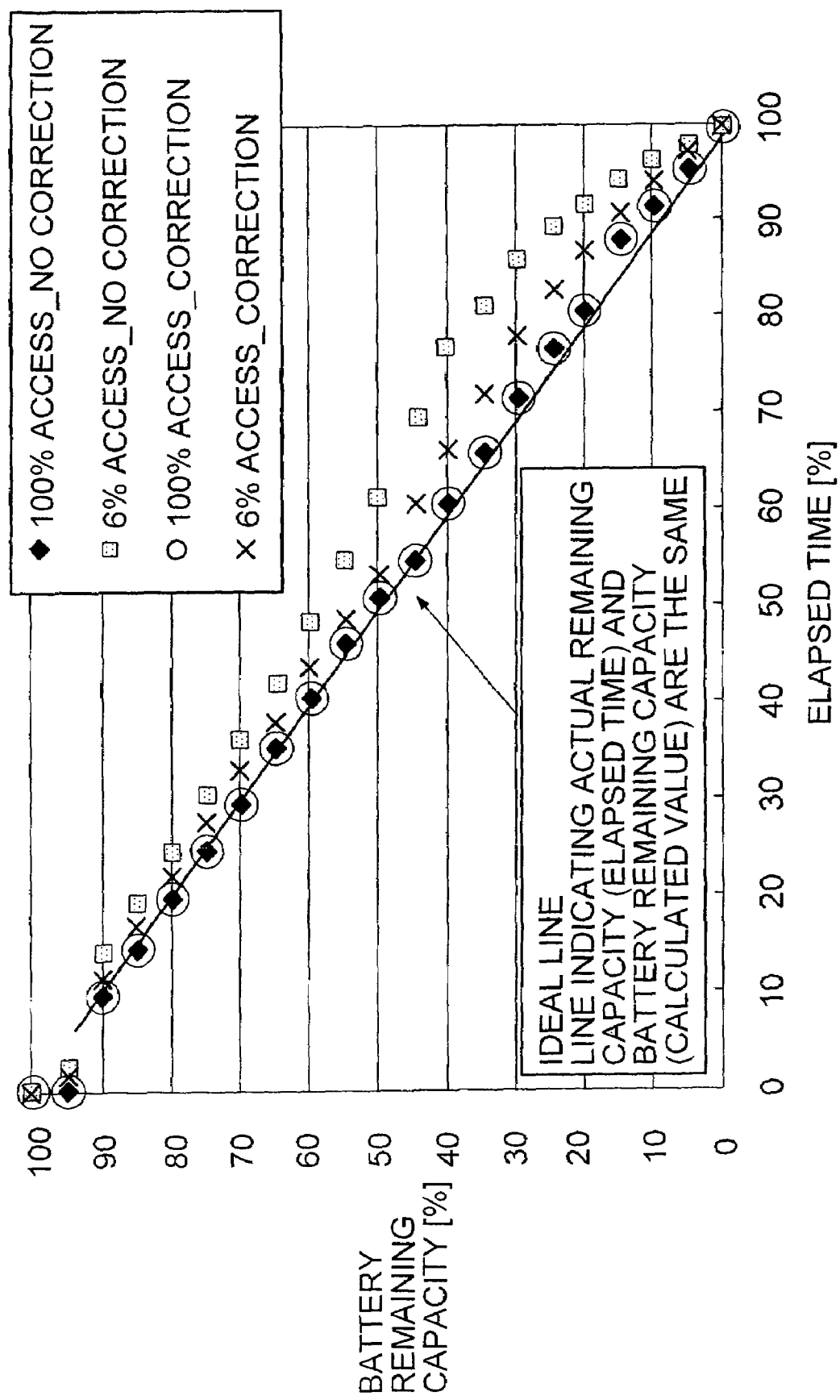
FIG. 17 is a graph showing a relation between an elapsed time and a battery remaining capacity in a case where a correction is made according to the operating state of the hard disk drive and a case where no correction is made.

FIG. 17 is a graph showing a relation between an elapsed time and a battery remaining capacity when a case where a correction is made according to the operating states of the hard disk drive 14 (this embodiment) and a case where no correction is made are compared. In FIG. 17, the case where no correction is made according to the operating states of the hard disk drive 14 means a case where in all states where the hard disk drive 14 is not in the access state, all calculations are made using the current consumption in the performance idle state.

As can be seen from FIG. 17, when the access rate of the hard disk drive 14 is 100% of the total, the precision remains unchanged regardless of the presence or absence of a correction. However, when the access rate of the hard disk drive 14 is 6% of the total, it is known that the load of the hard disk drive 14 is estimated larger than the actual one if no correction is made, so that a distance from an ideal line becomes larger and thereby the precision drops greatly.

Third Embodiment

Figure 19:
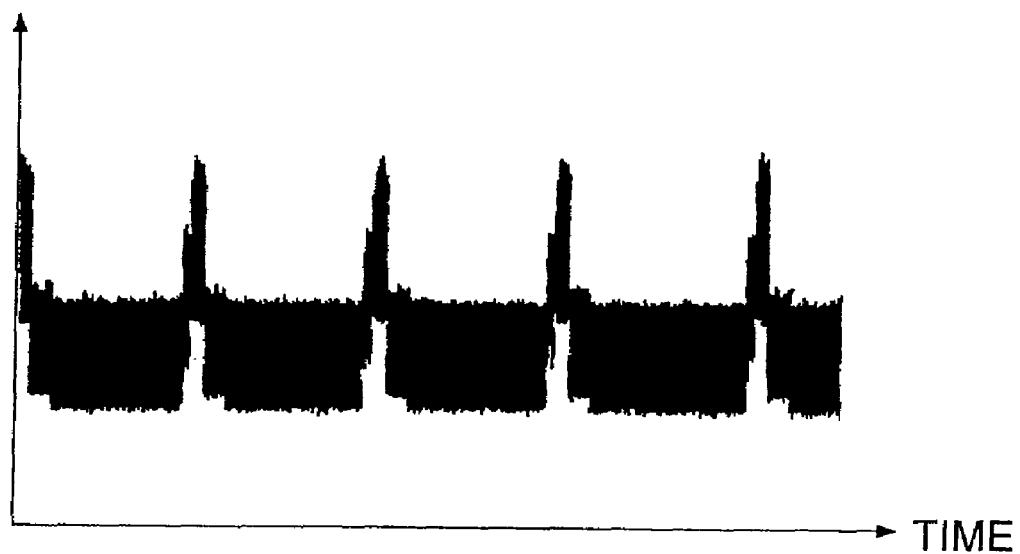
FIG. 19 is a diagram showing an example of a graph of a relation between a load current and a time when the information terminal is playing a slide show.

First, a basic concept of a battery remaining capacity calculating method according to this embodiment will be described based on FIG. 19. FIG. 19 is a diagram showing an example of a graph of a relation between a load current and a time when an information terminal according to this embodiment is playing a slide show.

As can be seen from FIG. 19, the load current increases regularly at certain time intervals while the information terminal is playing the slide show. This is because the hard disk drive is accessed regularly at the certain time intervals while the slide show is being played. In the example in FIG. 19, the hard disk drive is accessed in a cycle of about 30 seconds to about 40 seconds.

Since the load current increases while the hard disk drive is accessed although it is a short time, the battery voltage also drops sharply. Hence, even if a battery voltage is acquired while the hard disk drive is accessed, this battery voltage is not regarded as the voltage which correctly reflects the battery remaining capacity. Accordingly, in this embodiment, when the information terminal is executing processing such as the slide show in which the hard disk drive is accessed at certain time intervals, the battery voltage is measured after the access to the hard disk drive is completed and then the battery remaining capacity is calculated. A detailed explanation of the battery remaining capacity calculating method in the information terminal according to this embodiment will be given below.

Incidentally, the internal configuration of the information terminal according to this embodiment is the same as that in FIG. 1 in the aforementioned first embodiment.

Figure 20:
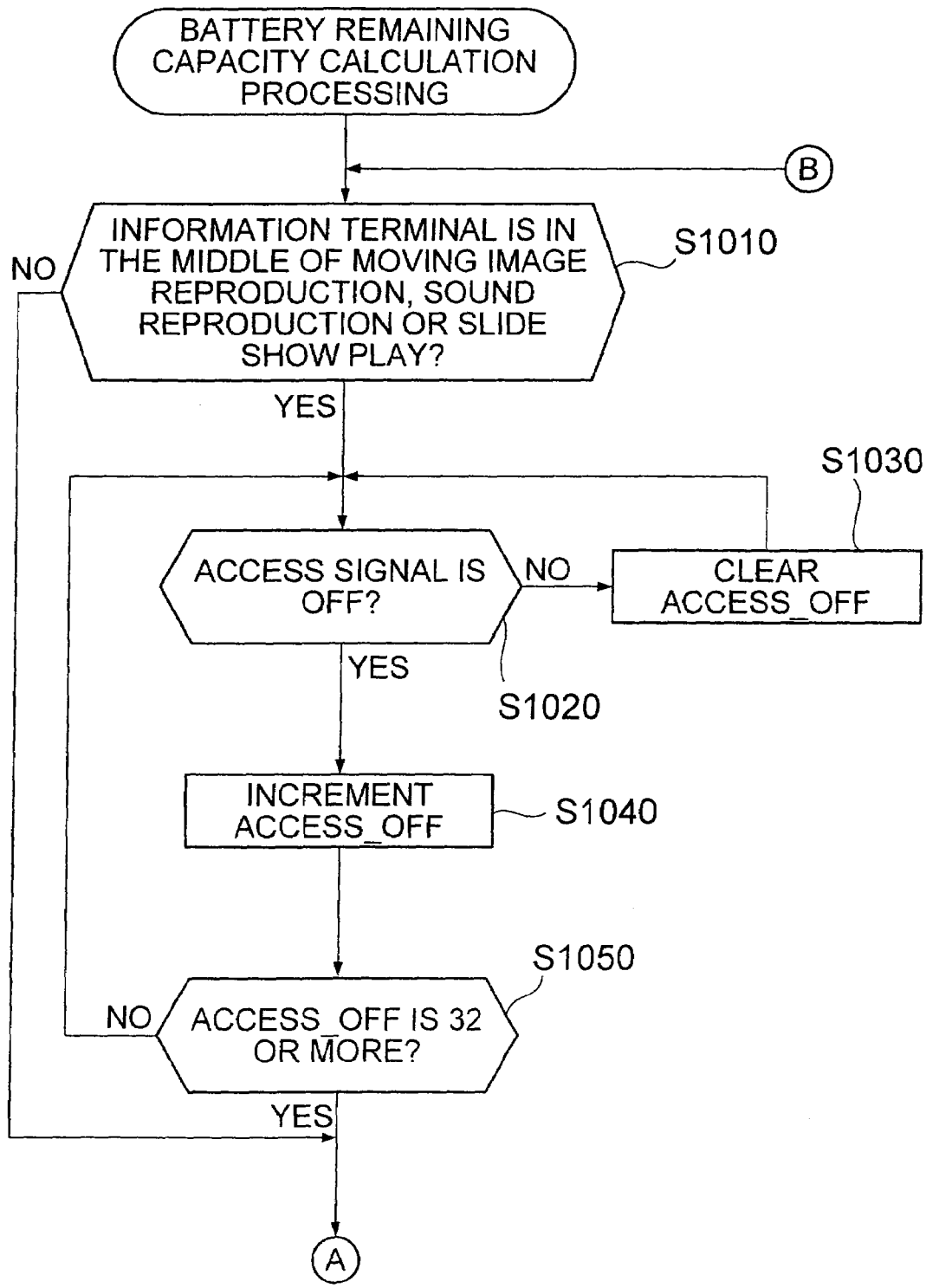
FIG. 20 is a flowchart explaining the contents of a battery remaining capacity calculation processing according to a third embodiment and the contents of a part of battery remaining capacity calculation processing according to a fourth embodiment (First part)
Figure 21:
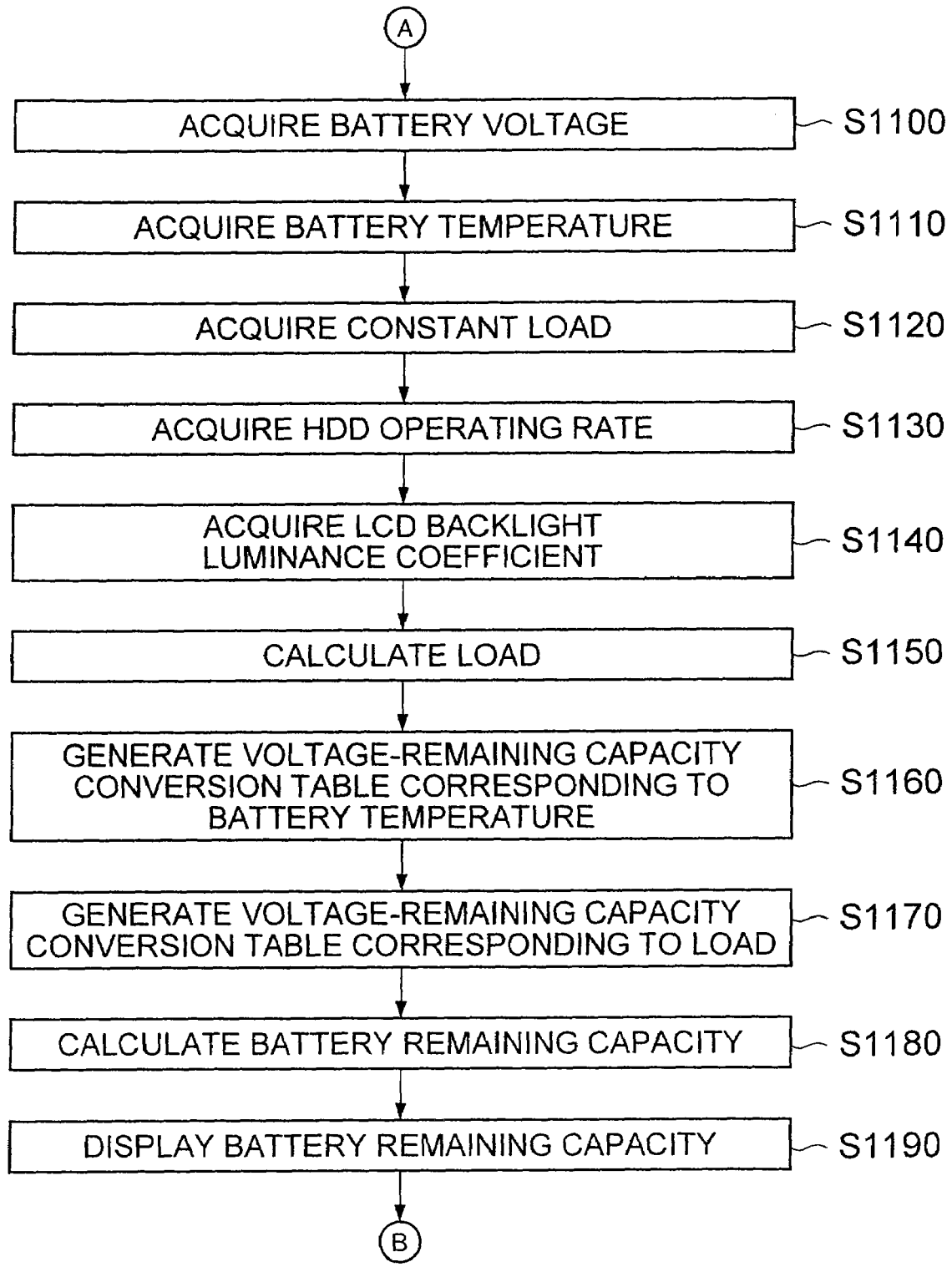
FIG. 21 is the flowchart explaining the contents of the battery remaining capacity calculation processing according to the third embodiment and the contents of a part of the battery remaining capacity calculation processing according to the fourth embodiment (Second part)

FIG. 20 and FIG. 21 are flowcharts explaining the contents of battery remaining capacity calculation processing according to this embodiment. The battery remaining capacity calculation processing shown in FIG. 20 and FIG. 21 is realized by making the CPU 10 read and execute a battery remaining capacity calculation processing program stored in the ROM 34. In this embodiment, this battery remaining capacity calculation processing is executed every 31.25 ms (32 times per second).

As shown in FIG. 20, it is first judged whether the information terminal is in the middle of moving image reproduction, sound reproduction, or slide show play (step S1010). Here, the moving image reproduction, sound reproduction, and slide show play are examples of the processing in which the hard disk drive is accessed at certain time intervals, and the processing in which the hard disk drive is accessed at the certain time intervals is not limited to the above.

When it is judged that the information terminal is in the middle of moving image reproduction, sound reproduction, or slide show play (step S1010: YES), it is judged whether the access signal outputted from the hard disk drive 14 to the CPU 10 indicates that the hard disk drive 14 is not being accessed (step S1020). When the access signal indicates that the hard disk drive is being accessed (step S1020: NO), a counter ACCESS_OFF is cleared and returned to zero (step S1030). Then, the processing returns to step S1020.

On the other hand, when the access signal indicates that the hard disk drive is not being accessed (step S1020: YES), the counter ACCESS_OFF is incremented by one (step S1040).

Then, the information terminal judges whether the counter ACCESS_OFF is 32 or more (step S1050). As described above, this battery remaining capacity calculation processing is executed 32 times per second, whereby the case where the counter ACCESS_OFF is 32 or more means that one second or more has passed since the access to the hard disk drive 14 was completed.

When the counter ACCESS_OFF is not 32 or more (step S1050: NO), the processing returns to step S1020 described above.

On the other hand, when the counter ACCES_OFF is 32 or more (step S1050: YES) or it is judged that the information terminal is neither in the middle of moving image reproduction, in the middle of sound reproduction, nor in the middle of slide show play (step S1010: NO), as shown in FIG. 21, the information terminal acquires a battery voltage which is a voltage of the battery 20 (step S1100). Namely, the voltage of the battery 20 detected by the voltage detecting circuit 40 is acquired as digital data via the AD converter 30.

Then, the information terminal acquires a battery temperature which is a temperature of the battery 20 (step S1110). Namely, the battery temperature as analog data detected by the temperature detecting circuit 42 provided in the battery 20 is acquired as digital data via the AD converter 30.

Thereafter, the information terminal acquires a constant load (step S1120). This constant load changes according to the operation mode of the CPU 10. In this embodiment, it is assumed that the CPU 10 has three operation modes: low-speed, medium-speed, and high-speed operation modes. The CPU 10 keeps track of in which mode out of these three operation modes the CPU 10 is at the moment. In this embodiment, the constant load is 400 mA in the low-speed mode, the constant load is 500 mA in the medium-speed mode, and the constant load is 600 mA in the high-speed mode.

Subsequently, the information terminal acquires a hard disk drive operating rate (step S1130). In this embodiment, based on the access signal outputted from the hard disk drive 14, the CPU 10 can calculate a ratio between a period of time when the hard disk drive 14 is accessed and a period of time when it is not accessed at any time. In this embodiment, this access period ratio is defined as the hard disk drive operating rate.

Then, the information terminal acquires an LCD backlight luminance coefficient (step S1140). In this embodiment, the CPU 10 outputs a luminance signal which controls the luminance of the LCD backlight 12 to the LCD backlight 12. Hence, the CPU 10 can keep track of a luminance coefficient of the LCD backlight 12 based on this luminance. In this embodiment, the LCD backlight luminance coefficient can be set between 0% and 100% in steps of 10%.

Thereafter, the information terminal calculates a load (step S1150). In this embodiment, the load is found by the following expression (7).

load=constant load+hard disk drive access load×hard disk drive operating rate+LCD load×LCD backlight luminance coefficient (7)

In this embodiment, it is assumed that the hard disk drive access load is, for example, 500 mA, and the LCD load is, for example, 100 mA. By substituting the constant load acquired in step S1120, the hard disk drive operating rate acquired in step S1130, and the LCD backlight luminance coefficient acquired in step S1140 into this expression, a current load can be calculated.

Subsequently, a voltage-remaining capacity conversion table which corresponds to the battery temperature is generated (step S1160). In this embodiment, four kinds of voltage-remaining capacity conversion tables according to temperature are stored in the ROM 34 in the CPU 10. The structures of the voltage-remaining capacity conversion tables stored in the ROM 34 in this embodiment are the same as those in FIG. 4 to FIG. 7 in the aforementioned first embodiment.

As can be seen from these figures, in this embodiment, the relation between the remaining capacity and the battery voltage is tabulated with three loads of 400 mA, 800 mA, and 1200 mA as representative values. Using these voltage-remaining capacity conversion tables, a voltage-remaining capacity conversion table at the battery temperature acquired in step S1110 is generated by line interpolation.

For example, it is assumed that the battery temperature acquired in step S1110 is 20° C. In this case, by linearly interpolating voltage values in the 15° C. voltage-remaining capacity conversion table TB20 shown in FIG. 5 and voltage values in the 25° C. voltage-remaining capacity conversion table TB30 shown in FIG. 6, voltage values in the 20° C. voltage-remaining capacity conversion table TB 50 are generated. More specifically, a voltage Y after correction can be calculated by the following expression (8)

$$Y = \frac{(Y2 - Y1)}{(T2 - T1)}(T - T1) + Y1 \quad \text{where } T1 < T2 \tag{8}$$

where T1 (15° C.) is the temperature of the low-temperature side voltage-remaining capacity conversion table, T2 (25° C.) is the temperature of the high-temperature side voltage-remaining capacity conversion table, T (20° C.) is the battery temperature, Y1 is a voltage value at T1, and Y2 is a voltage value at T2.

Consequently, the voltage-remaining capacity conversion table TB50 when the calculated battery temperature is 20° C. is as shown in FIG. 8. This voltage-remaining capacity conversion table TB50 is stored in the RAM 32 of the CPU 10.

Incidentally, in this embodiment, by using the 5° C. and 15° C. voltage-remaining capacity conversion tables when the battery temperature is lower than 5° C. and using the 25° C. and 45° C. voltage-remaining capacity conversion tables when the battery temperature is higher than 45° C., and substituting corresponding values into the expression (8), voltage-remaining capacity conversion tables at these temperatures can be obtained.

Then, as shown in FIG. 21, the information terminal generates a voltage-remaining capacity conversion table corresponding to the load calculated in step S1150 (step S1170). Namely, based on the voltage-remaining capacity conversion table generated in step S1160, the voltage-remaining capacity conversion table corresponding to the load calculated in step S1150 is generated and stored in the RAM 32.

For example, it is assumed that the load calculated in step S1150 is 1000 mA. In this case, by linearly interpolating voltage values at 800 mA and voltage values at 1200 mA in the voltage-remaining capacity conversion table TB50 shown in FIG. 8, voltage values in the voltage-remaining capacity conversion table TB60 at 1000 mA are generated. More specifically, a voltage Y after correction can be calculated by the following expression (9)

$$Y = \frac{(Y2 - Y1)}{(L2 - L1)}(L - L1) + Y1 \quad \text{where } L1 < L2 \tag{9}$$

where L1 (800 mA) is a low-load side current value, L2 (1200 mA) is a high-load side current value, L is the load calculated in step S1150, Y1 is a voltage value at L1, and Y2 is a voltage value at L2.

Consequently, the voltage-remaining capacity conversion table TB60 when the calculated load is 1000 mA is as shown in FIG. 9.

Thereafter, as shown in FIG. 21, the information terminal calculates a battery remaining capacity based on the voltage-remaining capacity conversion table TB60 after the load is corrected and the temperature is corrected (step S1180). Namely, by linearly interpolating numerical values in the voltage-remaining capacity conversion table TB60 stored in the RAM 32, a battery remaining capacity corresponding to the battery voltage acquired in step S1100 is calculated.

For example, it is assumed that the battery voltage acquired in step S1100 is 3.55 V In this case, by linearly interpolating 3.54 V (battery remaining capacity of 40%) and 3.60 V (battery remaining capacity of 50%) in the voltage-remaining capacity conversion table TB60 shown in FIG. 9, the battery remaining capacity when the battery voltage is 3.55 V is calculated. More specifically, a battery remaining capacity X after correction can be calculated by the following expression (10)

$$Y = \frac{(X2 - X1)}{(Y2 - Y1)}(Y - Y1) + X1 \quad \text{where } Y1 < Y2 \tag{10}$$

where Y1 (3.54 V) is a low-voltage side voltage value, Y2 (3.60 V) is a high-voltage side voltage value, Y is the voltage acquired in step S1100, X1 is a battery remaining capacity at Y1, and X2 is a battery remaining capacity at Y2.

Consequently, the result of calculation of the battery remaining capacity is approximately 42%. In this embodiment, this calculated battery remaining capacity is temporarily stored in the RAM 32.

Thereafter, as shown in FIG. 21, the information terminal reads the calculated battery remaining capacity from the RAM 32 and displays it on the display 18 (step S1190). Various methods of displaying the battery remaining capacity are thought out. For example, with a screen of the information terminal as the display 18, 42% may be displayed numerically, or with a bar-form liquid crystal display as the display 18, a bar of this liquid crystal display may have a length corresponding to 42%.

As described above, according to this embodiment, the operating rate of a unit (for example, the hard disk drive 14, the LCD backlight 12, the operation mode of the CPU 10, or the like) which greatly contributes to load change is calculated by measuring a signal which the unit outputs or a signal which the unit receives, and by making a correction based on the calculated result, the battery remaining capacity is displayed with high precision. Moreover, the correction is made using the CPU 10 which is originally built in the information terminal, whereby the addition of a new unit is not necessary, which can realize size reduction and cost reduction of the information terminal.

Further, the battery temperature of the battery 20 is detected using the temperature detecting circuit 42 and the correction is further made based on this battery temperature, whereby the battery remaining capacity can be displayed with higher precision.

Furthermore, when the information terminal is performing such processing that the hard disk drive 14 is accessed at certain time intervals, the processing of calculating the battery remaining capacity is not performed while the hard disk drive 14 is being accessed. After the access to the hard disk drive 14 is completed, the processing of calculating the battery remaining capacity is performed, so that the battery remaining capacity can be calculated excluding a period when, due to the access to the hard disk drive 14, the load increases in a short time and thereby the voltage of the battery 20 drops sharply. Consequently, the battery remaining capacity can be calculated with higher precision.

Fourth Embodiment

In the aforementioned third embodiment, the hard disk drive operating rate is calculated based on the access signal of the hard disk drive 14 to calculate the load of the hard disk drive 14, but in the fourth embodiment, as in the aforementioned second embodiment, the state of the hard disk drive 14 is specified more precisely, and thereby the load of the hard disk drive 14 is found more precisely.

Incidentally, it is assumed that the hard disk drive 14 according to this embodiment has five operating states such as shown in FIG. 10 and FIG. 11 as in the aforementioned second embodiment. It is also assumed that the internal configuration of the information terminal is the same as that in FIG. 14 in the aforementioned second embodiment.

Figure 22:
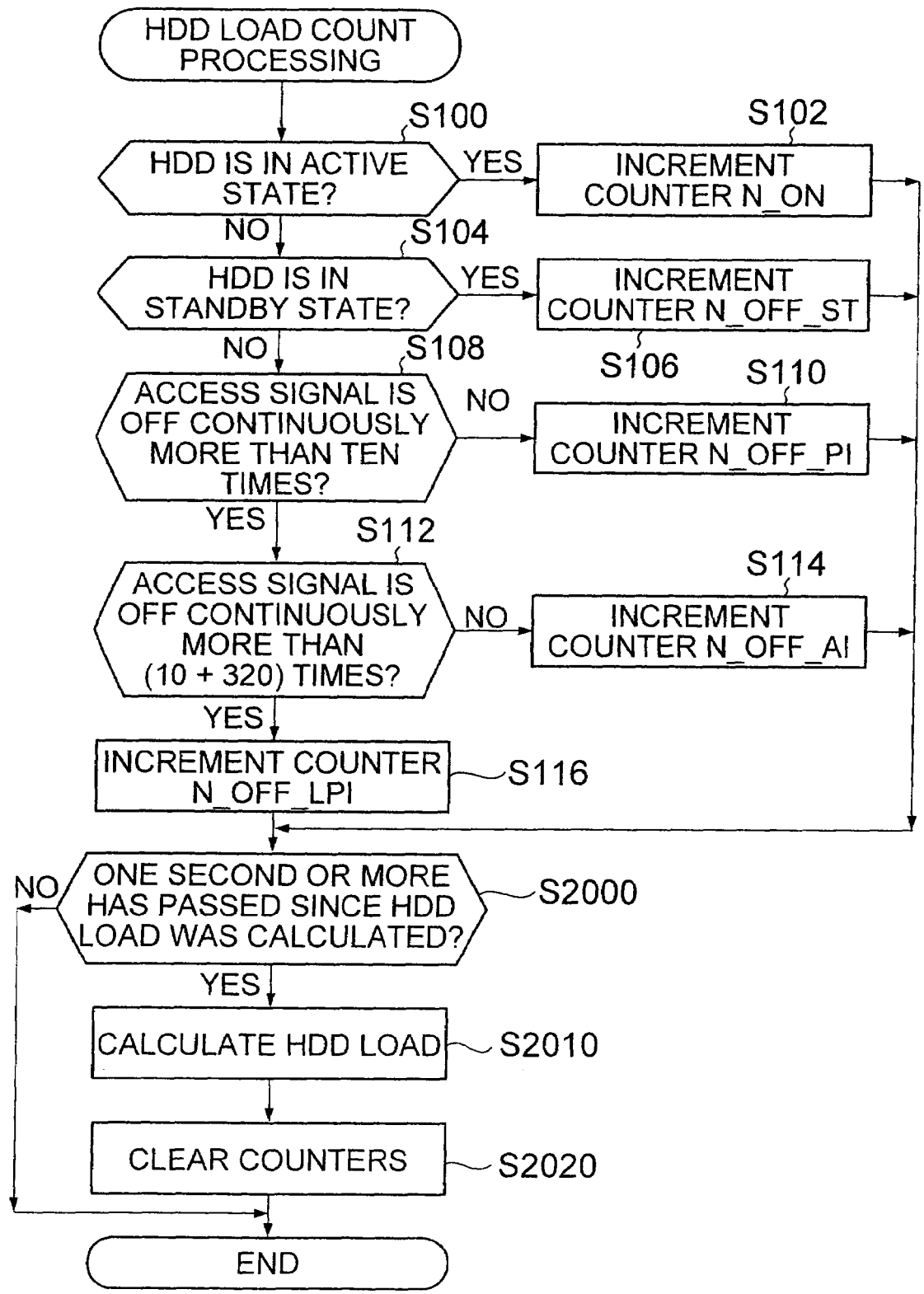
FIG. 22 is a flowchart explaining the contents of hard disk drive load count processing according to the fourth embodiment and a sixth embodiment.

Next, hard disk drive load count processing in this embodiment will be explained. FIG. 22 is a flowchart explaining the contents of the hard disk drive load count processing according to this embodiment. The hard disk drive load count processing shown in FIG. 22 is realized by making the CPU 10 read and execute a hard disk drive load count processing program stored in the ROM 34. This hard disk drive load count processing is started every 31.25 ms to make a count as described above.

The processing from step S100 to step S116 of the hard disk drive load count processing in FIG. 22 is the same as that in the aforementioned second embodiment.

After these step S102, step S106, step S110, step S114, and step S116, the information terminal judges whether one second or more has passed since the load of the hard disk drive 14 was calculated last time (step S2000). When one second or more has not passed (step S2000: NO), this hard disk drive load count processing is ended.

On the other hand, when one second or more has passed since the load of the hard disk drive 14 was calculated (step S2000: YES), the hard disk drive load is calculated (step S2010). In this embodiment, the load of the hard disk drive 14 is calculated based on the aforementioned expression (5). Namely, the load of the hard disk drive 14 is calculated based on values of respective counters as a result of samplings of the state of the hard disk drive 14 during the immediately preceding one second. More specifically, by substituting the count number of N_ON, the count number of N_OFF PI, the count number of N_OFF_AI, the count number of N_OFF_LPI, and the count number of N_OFF_ST into the expression (5), the current load of the hard disk drive 14 can be calculated.

Then, the information terminal clears these counters N_ON, N_OFF_PI, N_OFF_AI, N_OFF_LPI, and N_OFF_ST and sets them to zero (step S2020). Then, this hard disk drive load count processing is ended.

Figure 23:
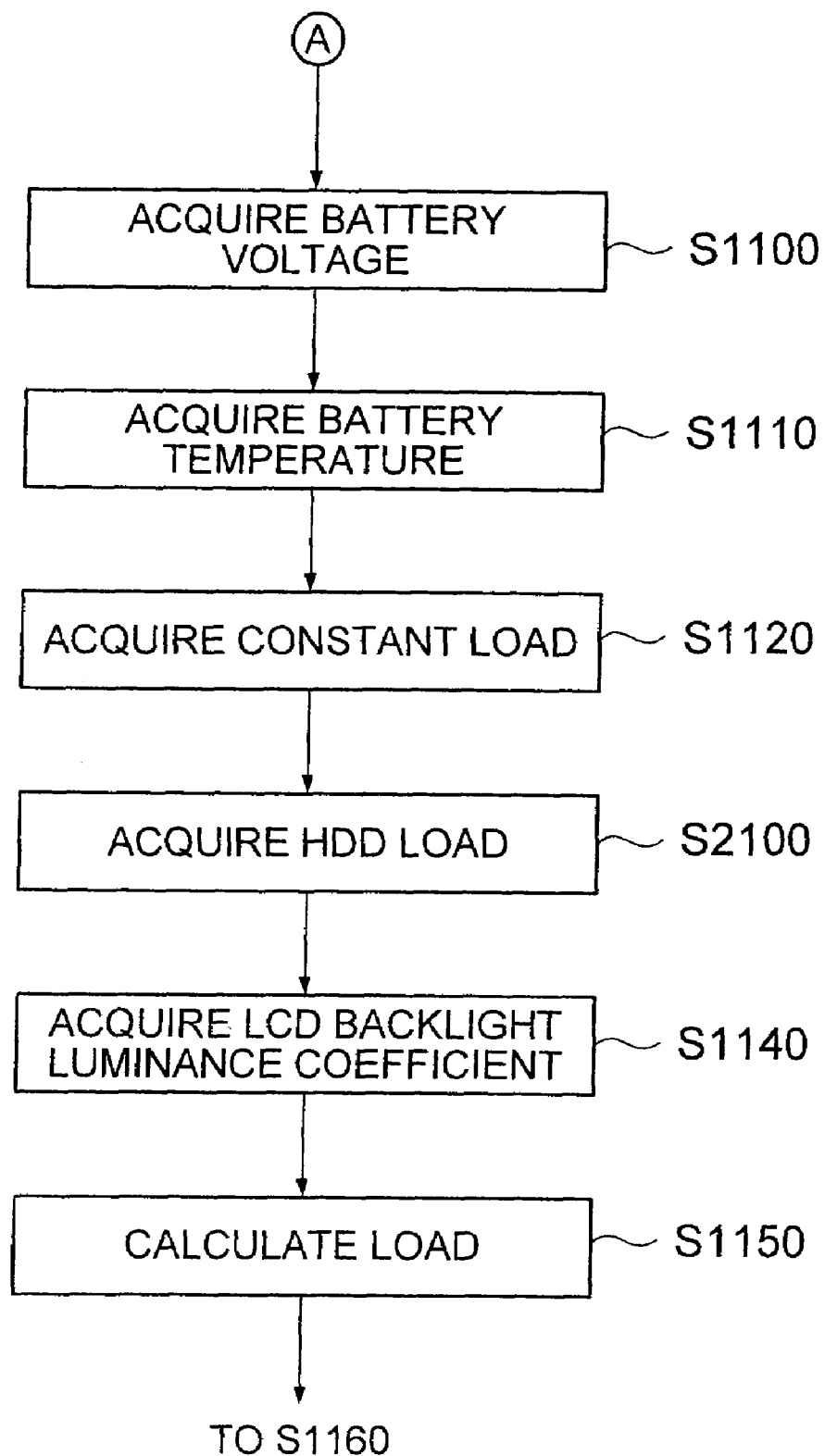
FIG. 23 is a flowchart explaining the contents of a part of the battery remaining capacity calculation processing according to the fourth embodiment.

Next, battery remaining capacity calculation processing in this embodiment will be explained. FIG. 23 is a part of a flowchart explaining the contents of the battery remaining capacity calculation processing according to this embodiment and shows processing subsequent to FIG. 20 in the third embodiment. This battery remaining capacity calculation processing shown in FIG. 23 is realized by making the CPU 10 read and execute a battery remaining capacity calculation processing program stored in the ROM 34. In this embodiment, this battery remaining capacity calculation processing is started once per second.

As shown in FIG. 23, when the information terminal is neither in the middle of moving image reproduction, in the middle of sound reproduction, nor in the middle of slide show play (step S1010: NO) or one second or more has passed since the access to the hard disk drive is completed (step S1050: Yes) in FIG. 20, the information terminal acquires a battery voltage which is a voltage of the battery 20 (step S1100). Namely, the voltage of the battery 20 detected by the voltage detecting circuit 40 is acquired as digital data via the AD converter 30.

Then, the information terminal acquires a battery temperature which is a temperature of the battery 20 (step S1110). Namely, the battery temperature as analog data detected by the temperature detecting circuit 42 provided in the battery 20 is acquired as digital data via the AD converter 30.

Thereafter, the information terminal acquires a constant load (step S1120). This constant load changes according to the operation mode of the CPU 10. In this embodiment, it is assumed that the CPU 10 has three operation modes: low-speed, medium-speed, and high-speed operation modes. The CPU 10 keeps track of in which mode out of these three operation modes the CPU 10 is at the moment. In this embodiment, the constant load is 400 mA in the low-speed mode, the constant load is 500 mA in the medium-speed mode, and the constant load is 600 mA at the high-speed mode.

Subsequently, the information terminal acquires a load of the hard disk drive 14 (step S2100). More specifically, the information terminal acquires the load of the hard disk drive 14 calculated by the aforementioned hard disk drive load count processing.

Then, the information terminal acquires an LCD backlight luminance coefficient (step S1140). In this embodiment, the CPU 10 outputs a luminance signal which controls the luminance of the LCD backlight 12 to the LCD backlight 12. Hence, the CPU 10 can keep track of a luminance coefficient of the LCD backlight 12 based on this luminance. In this embodiment, the LCD backlight luminance coefficient can be set between 0% and 100% in steps of 10%.

Thereafter, the information terminal calculates a whole load (step S1150). In this embodiment, the whole load is calculated based on the aforementioned expression (6). The processing after this is the same as that in the aforementioned third embodiment, and hence the explanation thereof is omitted. Moreover, the voltage-remaining capacity conversion tables TB10 to TB40 according to temperature included in the information terminal according to this embodiment are the same as those in FIG. 4 to FIG. 7 in the aforementioned third embodiment, and hence the explanation thereof is omitted.

As described above, according to this embodiment, the load of the hard disk drive 14 is calculated with higher precision based on the operating states of the hard disk drive 14. Consequently, the battery remaining capacity can be displayed with higher precision.

Moreover, when the information terminal is performing such processing that the hard disk drive 14 is accessed at certain time intervals, the processing of calculating the battery remaining capacity is not performed while the hard disk drive 14 is being accessed. After the access to the hard disk drive 14 is completed, the processing of calculating the battery remaining capacity is performed, so that the battery remaining capacity can be calculated excluding a period when, due to the access to the hard disk drive 14, the load increases in a short time and thereby the voltage of the battery 20 drops sharply. Consequently, the battery remaining capacity can be calculated with higher precision.

Fifth Embodiment

The fifth embodiment is a modification of the aforementioned third embodiment. The hard disk drive operating rate which is the load of the hard disk drive 14 is monitored, and the battery remaining capacity is calculated when the hard disk drive operating rate is lower than a given value, but the battery remaining capacity is not calculated when it is equal to or higher than the given value. This makes it possible to avoid calculating the battery remaining capacity with a large error when the load of the hard disk drive 14 temporarily increases. Only points different from the aforementioned third embodiment will be described below.

Figure 24:
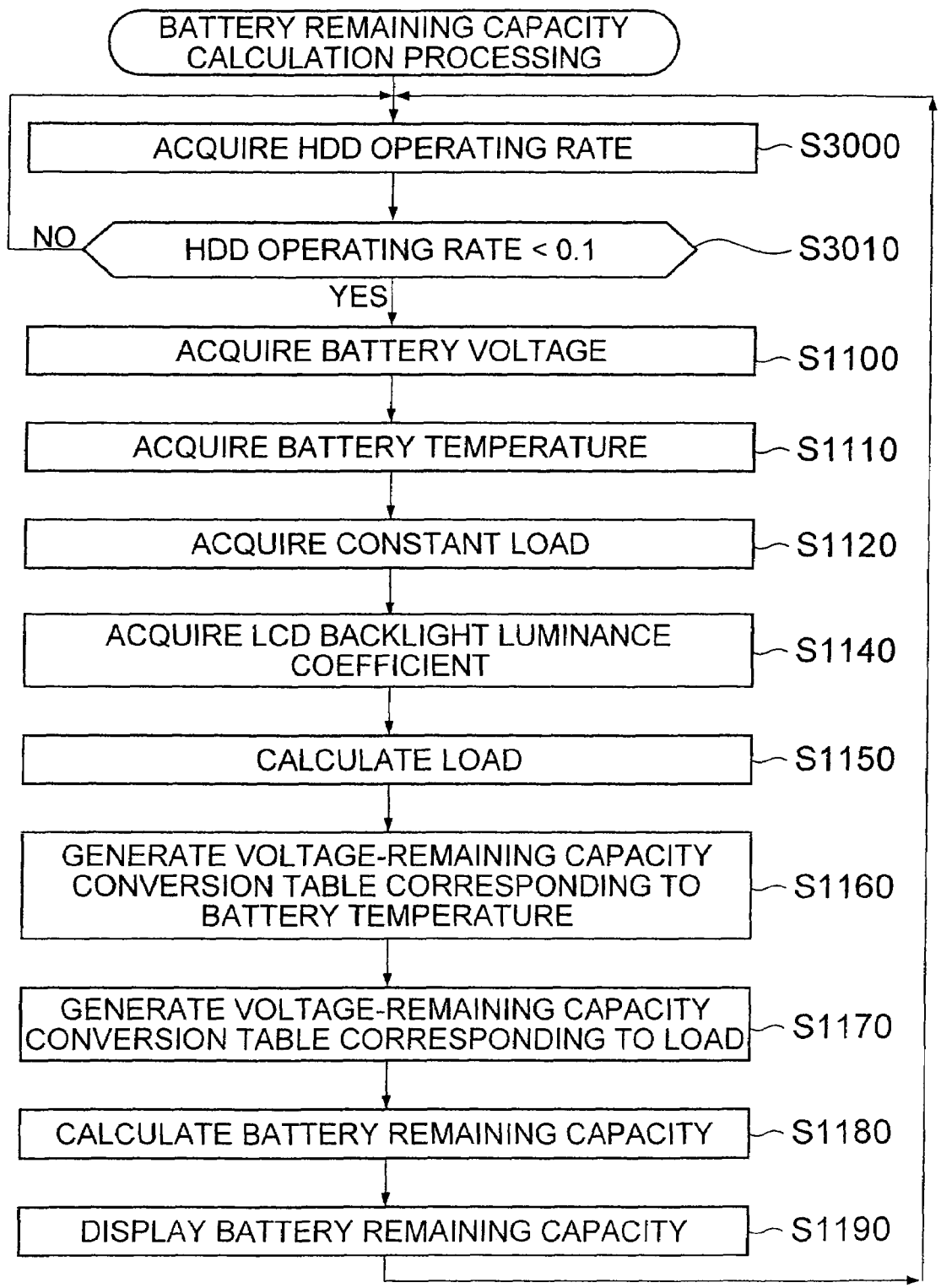
FIG. 24 is a flowchart explaining the contents of battery remaining capacity calculation processing according to a fifth embodiment.

FIG. 24 is a flowchart explaining the contents of battery remaining capacity calculation processing according to this embodiment. This battery remaining capacity calculation processing shown in FIG. 24 is realized by making the CPU 10 read and execute a battery remaining capacity calculation processing program stored in the ROM 34. In this embodiment, this battery remaining capacity calculation processing is executed regularly at certain time intervals.

As shown in FIG. 24, first, the information terminal acquires a hard disk drive operating rate (step S3000). This hard disk drive operating rate is a numeric value obtained by the CPU 10 calculating a ratio between a period of time when the hard disk drive 14 is accessed and a period of time when it is not accessed based on the access signal outputted from the hard disk drive 14 as in the aforementioned third embodiment.

Then, the information terminal judges whether the hard disk drive operating rate is lower than a given value (step S3010). In this embodiment, for example, whether the hard disk drive operating rate is lower than 0.1 is judged. Here, the idea that the hard disk drive operating rate is lower than 0.1 means that, for example, when the period of time when the hard disk drive 14 is accessed during the immediately preceding one second is defined as 1, the period of time when the hard disk drive 14 is not accessed is larger than 10.

When the hard disk drive operating rate is not lower than 0.1 (step S3010: NO), the processing returns to step S3000. Namely, the subsequent processing for calculating the battery remaining capacity is not performed.

On the other hand, when the hard disk drive operating rate is lower than 0.1 (step S3010: YES), as in the aforementioned third embodiment, the processing from step S1100 to step S1190 is performed. Note that the hard disk drive operating rate is acquired in step S3000, so that step S1130 can be omitted.

As described above, according to the information terminal of this embodiment, when the load of the hard disk drive 14 is lower than the given value, the processing of calculating the battery remaining capacity is performed, but when the load is equal to or higher than the given value, the processing of calculating the battery remaining capacity is not performed. Consequently, the battery remaining capacity can be calculated excluding a period when, due to the access to the hard disk drive 14, the load increases in a short time and thereby the voltage of the battery 20 drops sharply. Consequently, the battery remaining capacity can be calculated with higher precision.

Sixth Embodiment

The sixth embodiment is a modification of the aforementioned fourth embodiment. The hard disk drive load is monitored, and the battery remaining capacity is calculated when the hard disk drive load is lower than a given value, but the battery remaining capacity is not calculated when it is equal to or higher than the given value. This makes it possible to avoid calculating the battery remaining capacity with a large error when the load of the hard disk drive 14 temporarily increases. Only points different from the aforementioned fourth embodiment will be described below.

Figure 25:
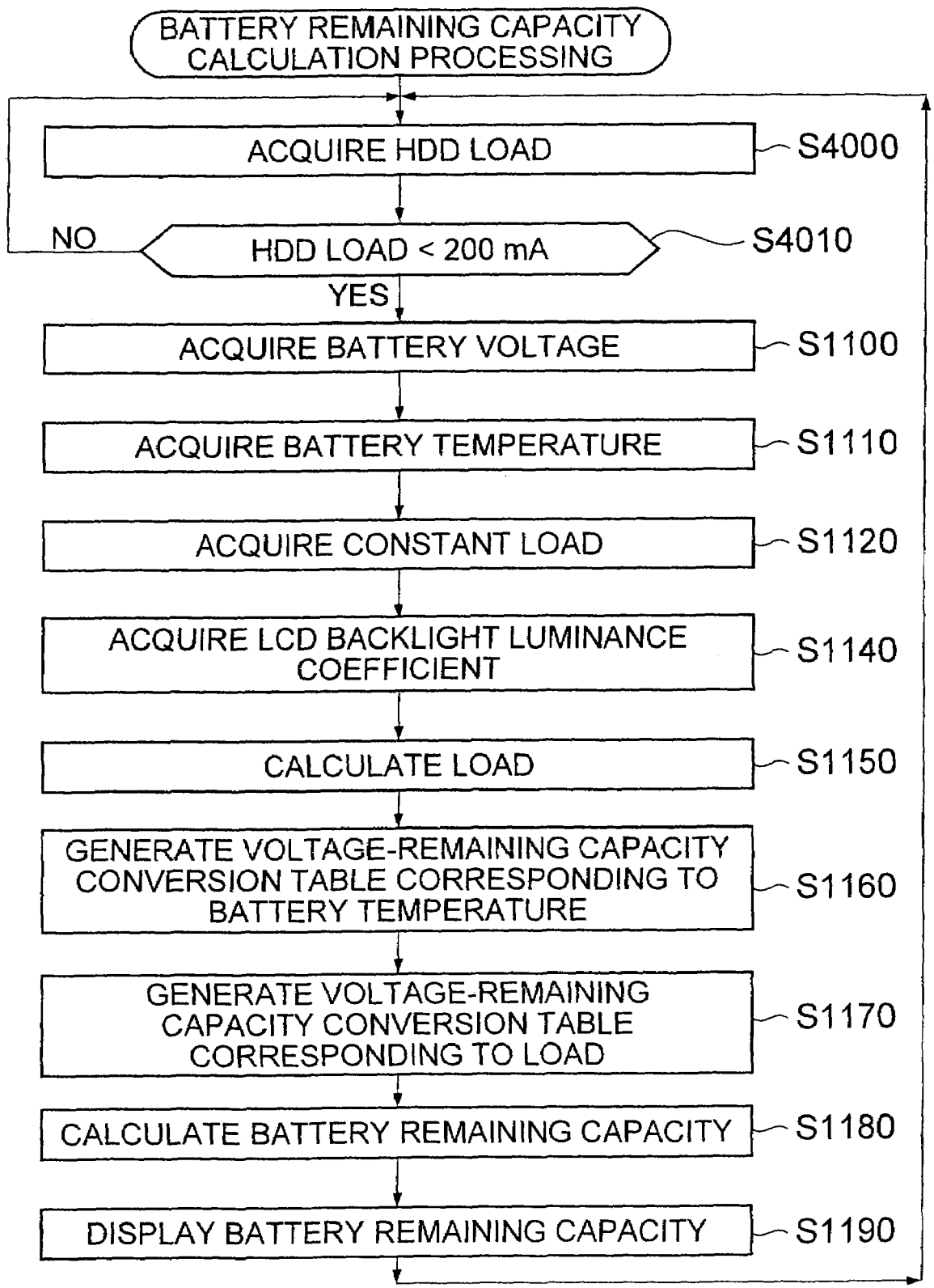
FIG. 25 is a flowchart explaining the contents of battery remaining capacity calculation processing according to the sixth embodiment.

FIG. 25 is a flowchart explaining the contents of battery remaining capacity calculation processing according to this embodiment. This battery remaining capacity calculation processing shown in FIG. 25 is realized by making the CPU 10 read and execute a battery remaining capacity calculation processing program stored in the ROM 34. In this embodiment, this battery remaining capacity calculation processing is executed regularly at certain time intervals.

As shown in FIG. 25, first, the information terminal acquires a load of the hard disk drive 14 (step S4000). This load of the hard disk drive 14 is a numeric value calculated by the hard disk drive load count processing explained in the aforementioned fourth embodiment.

Then, the information terminal judges whether load of the hard disk drive 14 is lower than a given value (step S4010). In this embodiment, for example, whether the load of the hard disk drive 14 is lower than 200 mA is judged. Here, the idea that the load of the hard disk drive 14 is lower than 200 mA means that in the aforementioned example, approximately one or more second has passed since the hard disk drive 14 was brought into the active idle state where the current consumption is 190 mA.

When the load of the hard disk drive 14 is not lower than 200 mA (step S4010: NO), the processing returns to step S4000. Namely, the subsequent processing for calculating the battery remaining capacity is not performed.

On the other hand, when the load of the hard disk drive 14 is lower than 200 mA (step 4010: YES), as in the aforementioned fourth embodiment, the processing from step S1100 to step S1190 is performed. Note that the load of the hard disk drive 14 is acquired in step S4000, so that step S2100 can be omitted.

As described above, according to the information terminal of this embodiment, when the load of the hard disk drive 14 is lower than the given value, the processing of calculating the battery remaining capacity is performed, but when the load is equal to or higher than the given value, the processing of calculating the battery remaining capacity is not performed. Consequently, the battery remaining capacity can be calculated excluding a period when, due to the access to the hard disk drive 14, the load increases in a short time and thereby the voltage of the battery 20 drops sharply. Consequently, the battery remaining capacity can be calculated with higher precision.

It should be mentioned that the present invention is not limited to the aforementioned embodiments, and various changes may be made therein. For example, in the aforementioned embodiments, the battery remaining capacity is displayed as it is, but it may be converted into a remaining available time and then displayed. Namely, what users really want to know is information on how much more time the information terminal can be used under the same use as at present. In the aforementioned embodiments, load change can be estimated even in the information terminal with large load change, and therefore the remaining available time can be calculated based on the value of the load and the battery remaining capacity. It is needless to say that it may be displayed in real time. Hence, for example, when the user is browsing moving images, the user can precisely know how much more time the user can browse them, or when the user is backing up data, the user can precisely know how much more time the user can transfer data.

Moreover, in the aforementioned embodiments, the LCD backlight 12, the hard disk drive 14, and the CPU load are shown as examples of elements of a drive with large load change, but elements of the drive other than these may be added. Alternatively, out of these elements of the drive, some elements can be omitted. For example, the LCD backlight 12 does not exert much influence on load change, so that it may be left out of account when the load is calculated. Alternatively, the load may be calculated with these elements of the drive being set to a fixed constant. For example, the load may be calculated with the LCD backlight 12 being set to a fixed value of 100 mA irrespective of its luminance coefficient. Further, the hard disk drive 14 is an example of a data storage which stores data, and other kinds of data storages such as a flexible disk and a DVD are also available as long as they store data which the information terminal accesses.

Further, the current consumptions and periods of time when the respective states of the hard disk drive 14 are maintained used in the aforementioned embodiments are shown only as examples, and they change according to the model number of the hard disk drive 14 and firmware which controls it.

Furthermore, in the aforementioned third embodiment and fourth embodiment, only when the information terminal is performing the process of accessing the hard disk drive 14 at certain time intervals, the battery remaining capacity is calculated after the access to the hard disk drive 14 is completed, but even when the information terminal is not performing the processing of accessing the hard disk drive 14 at the certain time intervals, the battery remaining capacity may be calculated after the access to the hard disk drive 14 is completed.

Contrary to this, in the aforementioned fifth embodiment and sixth embodiment, only when the load of the hard disk drive 14 is lower than the given value irrespective of processing executed by the information terminal, the battery remaining capacity is calculated, but as in the aforementioned third embodiment and fourth embodiment, it is also possible that only when the information terminal is performing the processing of accessing the hard disk drive 14 at the certain time intervals, the battery remaining capacity is calculated when the load of the hard disk drive 14 is lower than the given value, and the battery remaining capacity is not calculated when the load thereof is equal to or higher than the given value.

Moreover, in the aforementioned embodiments, the processing of calculating the battery remaining capacity is not performed when the hard disk drive 14 is being accessed, but during this time, the display of the battery remaining capacity until this time may be continued as it is or the display of the battery remaining capacity may not be performed.

Further, in the aforementioned embodiments, the constant load is determined based on the operation mode of the CPU 10, but the constant load may be changed according to the operation mode of the information terminal. For example, as shown in FIG. 18, it is also possible to assume that the constant load is 200 mA when USB data transfer is performed as the processing contents executed by the information terminal, the constant load is 400 mA when still image reproduction is performed, and that the constant load is 450 mA when moving image reproduction is performed. This judgment needs to be performed in step S14 described above. Consequently, when the information terminal performs plural kinds of processing contents, the constant load can be obtained simply with high precision.

As concerns each processing explained in the aforementioned embodiments, it is possible to record a program to execute each processing on a recording medium such as a flexible disk, a CD-ROM (Compact Disc-Read Only Memory), a ROM, a memory card, or the like and distribute this program in the form of the recording medium. In this case, the aforementioned embodiments can be realized by making the information terminal read the recording medium on which this program is recorded and execute this program.

Furthermore, the information terminal sometimes has other programs such as an operating system, other application programs, and the like. In this case, by using these other programs in the information terminal, a command, which calls a program to realize processing equal to that in the aforementioned embodiments out of programs in the information terminal, may be recorded on the recording medium.

Moreover, such a program can be distributed not in the form of the recording medium but in the form of a carrier wave via a network. The program transmitted in the form of the carrier wave over the network is incorporated in the information terminal, and the aforementioned embodiments can be realized by executing this program.

Further, when being recorded on the recording medium or transmitted as the carrier wave over the network, the program is sometimes encrypted or compressed. In this case, the information terminal which has read the program from the recording medium or the carrier wave needs to execute the program after decrypting or expanding the program.

Figure 26:
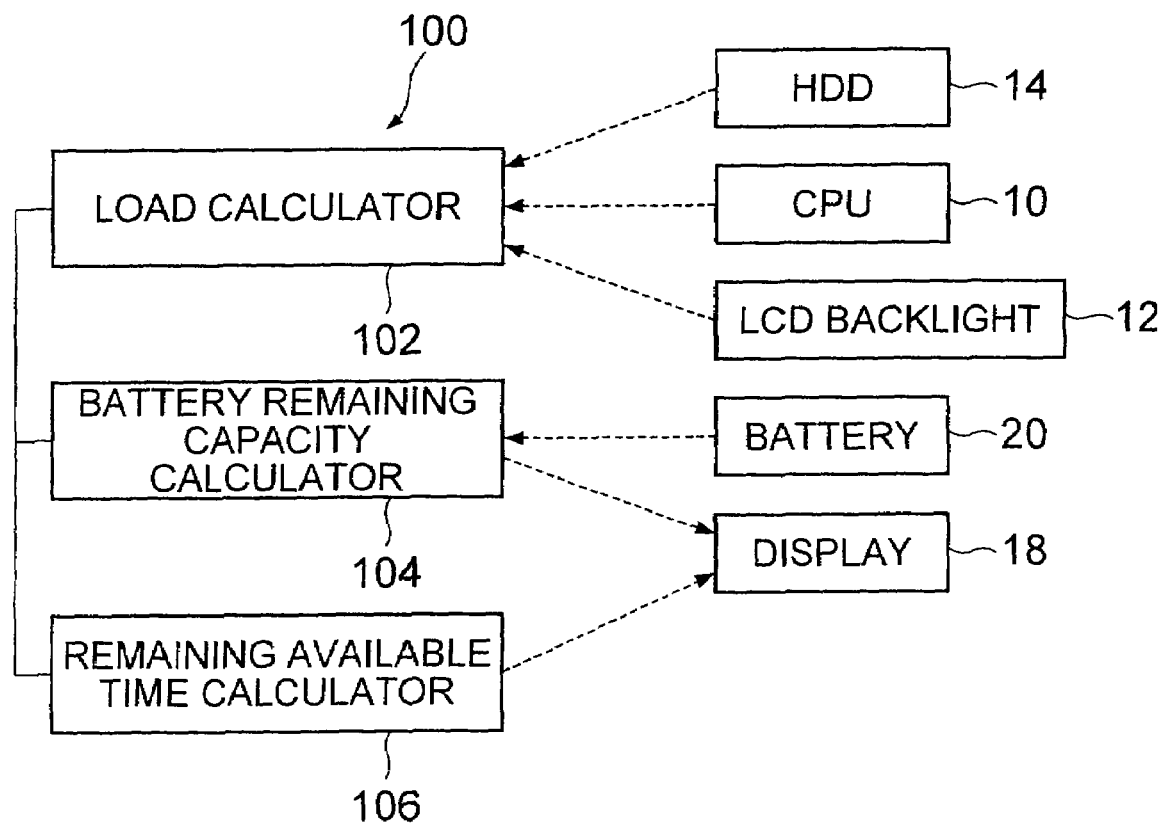
FIG. 26 is a diagram showing an example of a configuration when the battery remaining capacity calculation processing is realized by hardware.

Furthermore, the processing according to the aforementioned first embodiment and second embodiment can be realized by hardware as shown in FIG. 26. In FIG. 26, a controller 100 is composed of hardware such as an ASIC. In the example in FIG. 26, the controller 100 includes a load calculator 102, a battery remaining capacity calculator 104, and a remaining available time calculator 106.

The load calculator 102 calculates the load on the battery 20 in this information terminal. The battery remaining capacity calculator 104 calculates the battery remaining capacity based on the battery voltage, and at this time, calculates the battery remaining capacity corrected based on the load calculated by the load calculator 102.

Moreover, the load calculator 102 calculates the hard disk drive operating rate based on the ratio between a period of time when the hard disk drive 14 is accessed and a period of time when it is not accessed, and finds the load of the hard disk drive 14 based on the hard disk drive operating rate.

Further, when the hard disk drive 14 has plural states different in current consumption according to its operating state even if the hard disk drive 14 is not accessed, the load calculator 102 finds the load of the hard disk drive 14 based on a period of time when the hard disk drive 14 is accessed and periods of time in respective operating states when the hard disk drive is not accessed.

Furthermore, the load calculator acquires the operation mode of the CPU 10, and finds a load of the CPU 10 based on this operation mode. Besides, the load calculator 102 finds the load on the battery 20 based on processing contents processed by the information terminal.

Moreover, the load calculator 102 acquires the luminance of the LCD backlight 12, calculates the LCD backlight luminance coefficient of the LCD backlight 12 based on this luminance, and finds the load of the LCD backlight based on the LCD backlight luminance coefficient. Further, the battery remaining capacity calculator 104 acquires the battery temperature which is the temperature of the battery 20 and calculates the battery remaining capacity corrected based on the battery temperature when the battery remaining capacity is calculated.

Concrete contents of processing in which the load calculator 102 calculates the load and concrete contents of processing in which the battery remaining capacity calculator 104 calculates the battery remaining capacity are the same as the aforementioned processing contents in FIG. 3 and FIG. 16.

A display 18 displays the battery remaining capacity calculated by the battery remaining capacity calculator 104. The remaining available time calculator 106 calculates the remaining available time which indicates how much more time the information terminal can be used based on the battery remaining capacity calculated by the battery remaining capacity calculator 104 and the load calculated by the load calculator 102.

Moreover, when the processing according to the aforementioned third embodiment to sixth embodiment is realized by hardware, in the example in FIG. 26, the load calculator 102 calculates the load on the battery 20 in the information terminal. The battery remaining capacity calculator 104 calculates the battery remaining capacity based on the battery voltage, and at this time calculates the battery remaining capacity corrected based on the load calculated by the load calculator 102.

More specifically, in the aforementioned third embodiment and fifth embodiment, the load calculator 102 calculates the hard disk drive operating rate based on the radio between a period of time when the hard disk drive 14 is accessed and a period of time when it is not accessed, and finds the load of the hard disk drive 14 based on this hard disk drive operating rate.

Further, in the fourth embodiment and the sixth embodiment, when the hard disk drive 14 has plural states different in current consumption according to its operating state even if the hard disk drive 14 is not accessed, the load calculator 102 finds the load of the hard disk drive 14 based on a period of time when the hard disk drive 14 is accessed and periods of time in respective operating states when the hard disk drive is not accessed.

Furthermore, the load calculator 102 acquires the operation mode of the CPU 10, and finds the load of the CPU 10 based on this operation mode. Besides, the load calculator 102 finds the load on the battery 20 based on processing contents processed by the information terminal.

Moreover, the load calculator 102 acquires the luminance of the LCD backlight 12, calculates the LCD backlight luminance coefficient of the LCD backlight 12 based on this luminance, and finds the load of the LCD backlight based on the LCD backlight luminance coefficient.

Further, the battery remaining capacity calculator 104 acquires the battery temperature which is the temperature of the battery 20 and calculates the battery remaining capacity corrected based on the battery temperature when the battery remaining capacity is calculated. It is noted, however, that in the third embodiment and the fourth embodiment, when the information terminal is performing such processing that the hard disk drive 14 is accessed at certain time intervals, the battery remaining capacity calculator 104 does not calculate the battery remaining capacity until the access to the hard disk drive 14 is completed.

Furthermore, in the fifth embodiment and the sixth embodiment, when the load of the hard disk drive 14 calculated by the load calculator 100 is lower than a given value, the battery remaining capacity calculator 104 calculates the battery remaining capacity, but when the load is equal to or higher than the given value, it does not calculate the battery remaining capacity.

Concrete contents of processing in which the load calculator 102 calculates the load and concrete contents of processing in which the battery remaining capacity calculator 104 calculates the battery remaining capacity are the same as the aforementioned processing contents in the third embodiment and the sixth embodiment.

Additionally, the display 18 displays the battery remaining capacity calculated by the battery remaining capacity calculator 104. The remaining available time calculator 106 calculates the remaining available time which indicates how much more time the information terminal can be used based on the battery remaining capacity calculated by the battery remaining capacity calculator 104 and the load calculated by the load calculator 102.

What is claimed is:

1. An information terminal driven by a battery, comprising:
   a data storage configured to be driven upon receiving a supply of a power source from the battery, data being stored in the data storage;
   a voltage detector configured to detect a battery voltage which is a voltage of the battery;
   a battery remaining capacity calculator configured to calculate a battery remaining capacity based on the battery voltage, the battery remaining capacity calculator calculating the battery remaining capacity after access to the data storage is completed; and
   a load calculator configured to calculate a load on the battery of the data storage,
   wherein:
   the battery remaining capacity calculator calculates the battery remaining capacity corrected based on the load calculated by the load calculator,
   the data storage has at least a first operating state and a second operating state when the data storage is not accessed, a first current consumption of the first operating state being lower than an accessing current consumption in which the data storage is accessed and a second current consumption of the second operating state being lower than the first current consumption of the first operation state, and
   the load calculator finds a load of the data storage based on a period of time in the first operating state and a period of time in the second operating state when the data storage is not accessed, and whether the data storage is in the first operating state or the second operating state when the data storage is not accessed is determined based on duration in which the data storage has not been accessed.

2. The information terminal according to claim 1, further comprising a drive unit other than the data storage, which is driven upon receiving a supply of a power source from the battery, wherein
   the load calculator calculates loads on the battery of the drive unit and the data storage.

3. The information terminal according to claim 2, wherein the drive unit includes a central processing unit of the information terminal, and
the load calculator finds a load of the central processing unit based on an operation mode of the central processing unit.

4. The information terminal according to claim 2, wherein the load calculator finds the load on the battery based on processing contents processed by the information terminal.

5. The information terminal according to claim 2, wherein the drive unit includes an LCD backlight, and
the load calculator calculates an LCD backlight luminance coefficient of the LCD backlight based on a luminance of the LCD backlight and finds a load of the LCD backlight based on the LCD backlight luminance coefficient.

6. The information terminal according to claim 1, further comprising a temperature detector configured to detect a battery temperature which is a temperature of the battery, wherein
the battery remaining capacity calculator calculates the battery remaining capacity corrected based on the battery temperature detected by the temperature detector.

7. The information terminal according to claim 1, further comprising a display unit configured to display the battery remaining capacity calculated by the battery remaining capacity calculator.

8. The information terminal according to claim 1, fUrther comprising a remaining available time calculator configured to calculate a remaining available time which indicates how much more time the information terminal can be used based on the battery remaining capacity calculated by the battery remaining capacity calculator and the load calculated by the load calculator.

9. The information terminal according to claim 1, wherein when processing of accessing data stored in the data storage is performed at certain time intervals, the battery remaining capacity calculator calculates the battery remaining capacity after the access to the data storage is completed.

10. The information terminal according to claim 1, wherein when processing of accessing data stored in the data storage is performed at certain time intervals, the battery remaining capacity calculator calculates the battery remaining capacity after a lapse of a predetermined period of time from the completion of the access to the data storage.

11. An information terminal driven by a battery, comprising:
a data storage configured to be driven upon receiving a supply of a power source from the battery and store data;
a data storage load calculator configured to calculate a load on the battery of the data storage;
a voltage detector configured to detect a battery voltage which is a voltage of the battery; and
a battery remaining capacity calculator configured to calculate a battery remaining capacity based on the battery voltage, the battery remaining capacity calculator calculating the battery remaining capacity when the load of the data storage calculated by the data storage load calculator is lower than a given value,
wherein:
the battery remaining capacity calculator calculates the battery remaining capacity corrected based on the load calculated by the load calculator,
the data storage has at least a first operating state and a second operating state when the data storage is not accessed, a first current consumption of the first operating state being lower than an accessing current consumption in which the data storage is accessed and a second current consumption of the second operating state being lower than the first current consumption of the first operating state, and
the data storage load calculator finds a load of the data storage based on a period of time in the first operating state and a period of time in the second operating state when the data storage is not accessed, and whether the data storage is in the first operating state or the second operating state when the data storage is not accessed is determined based on duration in which the data storage has not been accessed.

12. A battery remaining capacity calculating method in an information terminal driven by a battery, comprising:
judging whether access to a data storage is completed, the data storage being driven upon receiving a supply of a power source from the battery;
calculating a battery remaining capacity based on a battery voltage which is a voltage of the battery after the access to the data storage is completed; and
calculating a load on the battery of the data storage,
wherein:
the calculating of the battery remaining capacity is corrected based on the calculated load,
the data storage has at least a first operating state and a second operating state when the data storage is not accessed, a first current consumption of the first operating state being lower than an accessing current consumption in which the data storage is accessed and a second current consumption of the second operating state being lower than the first current consumption of the first operating state, and
the calculating of the load comprises finding a load of the data storage based on a period of time in the first operating state and a period of time in the second operating state when the data storage is not accessed, and whether the data storage is in the first operating state or the second operating state when the data storage is not accessed is determined based on duration in which the data storage has not been accessed.

13. A battery remaining capacity calculating method in an information terminal driven by a battery, comprising:
calculating a load on the battery of a data storage which is driven upon receiving a supply of a power source from the battery; and
calculating a battery remaining capacity based on a battery voltage which is a voltage of the battery when the calculated load is lower than a given value,
wherein:
the calculating of the battery remaining capacity is corrected based on the calculated load,
the data storage has at least a first operating state and a second operating state when the data storage is not accessed, a first current consumption of the first operating state being lower than an accessing current consumption in which the data storage is accessed and a second current consumption of the second operating state being lower than the first current consumption of the first operating state, and
the calculating of the load comprises finding a load of the data storage based on a period of time in the first operating state and a period of time in the second operating state when the data storage is not accessed, and whether the data storage is in the first operating state or the second operating state when the data storage is not accessed is determined based on duration in which the data storage has not been accessed.

14. A recording medium, having a program for causing an information terminal driven by a battery to calculate a battery remaining capacity recorded thereon, wherein the program causes the information terminal to execute process comprising:

judging whether access to a data storage is completed, the data storage being driven upon receiving a supply of a power source from the battery;

calculating a battery remaining capacity based on a battery voltage which is a voltage of the battery after the access to the data storage is completed; and calculating a load on the battery of the data storage, wherein:

the calculating of the battery remaining capacity is corrected based on the calculated load, the data storage has at least a first operating state and a second operating state when the data storage is not accessed, a first current consumption of the first operating state being lower than an accessing current consumption in which the data storage is accessed and a second current consumption of the second operating state being lower than the first current consumption of the first operating state, and the calculating of the load comprises finding a load of the data storage based on a period of time in the first operating state and aperiod of time in the second operating state when the data storage is not accessed, and whether the data storage is in the first operating state or the second operating state when the data storage is not accessed is determined based on duration in which the data storage has not been accessed.

15. A recording medium, having a program for causing an information terminal driven by a battery to calculate a battery remaining capacity recorded thereon, wherein the program causes the information terminal to execute process comprising:

calculating a load on the battery of a data storage which is driven upon receiving a supply of a power source from the battery; and calculating a battery remaining capacity based on a battery voltage which is a voltage of the battery when the calculated load is lower than a given value, wherein:

the calculating of the battery remaining capacity is corrected based on the calculated load, the data storage has at least a first operating state and a second operating state when the data storage is not accessed, a first current consumption of the first operating state being lower than an accessing current consumption in which the data storage is accessed and a second current consumption of the second operating being lower than the first current consumption of the first operating state, and the calculating of the load comprises finding a load of the data storage based on a period of time in the first operatimg state and a period of time in the second operating state when the data storage is not accessed, and whether the data storage is in the first operating state or the second operating state when the data storage is not accessed is determined based on duration in which the data storage has not been accessed.

\* \* \* \* \*